(12) United States Patent
Tanaka et al.

(10) Patent No.: US 8,823,114 B2
(45) Date of Patent: Sep. 2, 2014

(54) SENSOR DEVICE HAVING ELECTRODE DRAW-OUT PORTIONS THROUGH SIDE OF SUBSTRATE

(75) Inventors: Shuji Tanaka, Sendai (JP); Masayoshi Esashi, Sendai (JP); Masanori Muroyama, Sendai (JP); Sakae Matsuzaki, Sendai (JP); Mitsutoshi Makihata, Sendai (JP); Yutaka Nonomura, Nagoya (JP); Motohiro Fujiyoshi, Seto (JP); Takahiro Nakayama, Nagoya (JP); Ui Yamaguchi, Toyota (JP); Hitoshi Yamada, Aichi-gun (JP)

(73) Assignees: Tohoku University, Sendai-Shi (JP); Kabushiki Kaisha Toyota Chuo Kenkyusho, Aichi-Gun (JP); Toyota Jidosha Kabushiki Kaisha, Toyota-Shi (JP)

( * ) Notice: Subject to any disclaimer, the term of this patent is extended or adjusted under 35 U.S.C. 154(b) by 148 days.

(21) Appl. No.: 13/502,083

(22) PCT Filed: Oct. 13, 2010

(86) PCT No.: PCT/JP2010/006092
§ 371 (c)(1),
(2), (4) Date: Apr. 13, 2012

(87) PCT Pub. No.: WO2011/045929
PCT Pub. Date: Apr. 21, 2011

(65) Prior Publication Data
US 2012/0199921 A1 Aug. 9, 2012

(30) Foreign Application Priority Data
Oct. 14, 2009 (JP) .................. PCT/JP2009/005361

(51) Int. Cl.
| | | |
|---|---|---|
| H01L 29/84 | (2006.01) |
| H01L 23/48 | (2006.01) |
| G01L 5/22 | (2006.01) |
| G01L 1/14 | (2006.01) |
| B81C 1/00 | (2006.01) |
| H01L 23/00 | (2006.01) |
| H01L 23/10 | (2006.01) |

(52) U.S. Cl.
CPC ... *B81C 1/00238* (2013.01); *H01L 2924/01006* (2013.01); *H01L 2924/01029* (2013.01); *H01L 24/04* (2013.01); *H01L 2924/01033* (2013.01); *H01L 2924/014* (2013.01); *H01L 24/32* (2013.01); *H01L 2924/14* (2013.01); *H01L 2924/01013* (2013.01); *H01L 2924/09701* (2013.01); *H01L 2924/3011* (2013.01); *H01L 2924/01057* (2013.01); *H01L 2924/01078* (2013.01); *H01L 24/82* (2013.01); *H01L 2924/30105* (2013.01); *H01L 2924/01079* (2013.01); *H01L 2924/3025* (2013.01); *H01L 24/29* (2013.01); *H01L 2924/01082* (2013.01); *H01L 2924/19041* (2013.01); *H01L 2924/01023* (2013.01); *H01L 24/94* (2013.01); *H01L 2924/01004* (2013.01); *H01L 23/10* (2013.01); *G01L 5/228* (2013.01); *G01L 1/146* (2013.01); *G01L 1/148* (2013.01); *B81C 2203/0792* (2013.01); *B81C 2201/019* (2013.01); *B81C 2203/032* (2013.01); *B81B 2201/0264* (2013.01); *B81B 2207/012* (2013.01)
USPC .......... 257/415; 257/417; 257/418; 257/735; 257/736

(58) Field of Classification Search
CPC .................. H01L 23/481; H01L 23/4822
USPC ............ 438/51, 611, 667; 257/415, 417, 418, 257/735, 736
See application file for complete search history.

(56) References Cited

U.S. PATENT DOCUMENTS

| | | | |
|---|---|---|---|
| 2006/0214294 A1* | 9/2006 | Fukasawa | 257/738 |
| 2010/0152699 A1* | 6/2010 | Ferrari et al. | 604/500 |
| 2011/0027930 A1* | 2/2011 | El-Gamal et al. | 438/51 |
| 2011/0083517 A1 | 4/2011 | Muroyama et al. | |

FOREIGN PATENT DOCUMENTS

| | | | |
|---|---|---|---|
| JP | 63-237481 A | 10/1988 |
| JP | 03621093 B2 | 4/1996 |
| JP | 2000-500617 A | 5/1997 |
| JP | 2006-281347 A | 10/2006 |
| JP | 2006-287520 A | 10/2006 |
| JP | 2006-337315 A | 12/2006 |
| JP | 2007-010482 A | 1/2007 |
| JP | 2007-078382 A | 3/2007 |
| JP | 2007-285784 A | 11/2007 |
| JP | 2007-335857 A | 12/2007 |
| WO | 2011/045835 A1 | 4/2011 |
| WO | 2011/045837 A1 | 4/2011 |

OTHER PUBLICATIONS

International Search Report mailed Dec. 21, 2010 of PCT/JP2009/006092.

M. Makihata, et al.: "Adhesive wafer bonding using a molded thick benzocyclobutene layer for wafer-level integration of MEMS and LSI", Journal of Micromechanics and Microengineering 21 (2011) 085002, pp. 1-7.

M. Makihata, et al.: "Integration and Packaging Technology of MEMS-ON-CMOS Tactile Sensor for Robot Application using Molded Thick BCB Layer and Backside-grooved Electrical Connection", IEEE 2011 Transducers'11, Beijing, China, Jun. 5-9, 2011, pp. 815-818.

* cited by examiner

*Primary Examiner* — Kevin Parendo

(74) *Attorney, Agent, or Firm* — Kenyon & Kenyon LLP

(57) ABSTRACT

Provided is a technique for packaging a sensor structure having a contact sensing surface and a signal processing LSI that processes a sensor signal. The sensor structure has the contact sensing surface and sensor electrodes. The signal processing integrated circuit is embedded in a semiconductor substrate. The sensor structure and the semiconductor substrate are bonded by a bonding layer, forming a sensor device as a single chip. The sensor electrodes and the integrated circuit are sealed inside the sensor device, and the sensor electrodes and external terminals of the integrated circuit are led out to the back surface of the semiconductor substrate through a side surface of the semiconductor substrate.

11 Claims, 31 Drawing Sheets

SENSOR DEVICE HAVING ELECTRODE DRAW-OUT PORTIONS THROUGH SIDE OF SUBSTRATE

This is a 371 national phase application of PCT/JP2010/006092 filed 13 Oct. 2010, which claims priority to International Application No. PCT/JP2009/005361 filed 14 Oct. 2009, the contents of which are incorporated herein by reference.

TECHNICAL FIELD

The present invention relates to a sensor device and a method for fabricating a sensor device.

BACKGROUND ART

Currently the development of humanoid robots is making progress.

For humanoid robots, advanced motions such as contacting with people, autonomously bypassing an obstruction and grasping and moving an object are required.

Because a tactile sense is required to achieve such motions, studies to provide the hands or the whole surface of a robot with a tactile sensor are under way (for example, see Patent Literature 1 to Patent Literature 6).

Existing tactile sensor systems typically have a mesh structure.

For example, a plurality of electrode lines are formed on each of two electrode sheets.

The electrode sheets are then placed opposite to each other in such a way that their electrode lines are orthogonal to each other, thereby forming mesh wiring lines.

A pressure-sensitive conductive member is interposed between the two electrode sheets, or a tactile sensor element is mounted at each intersection of the electrode lines.

Each tactile sensor element converts a pressure change or a temperature change due to contact with an object into an electrical signal change according to the amount of change.

A control unit is connected to each of the electrode lines and makes central control of a plurality of tactile sensor elements. Specifically, the control unit sequentially selects the tactile sensor elements and performs sampling of sensor values of the respective sensors. The control unit accumulates electrical signals from the tactile sensor elements and makes data processing.

By repeating such a sampling operation on a regular basis, whether a robot is in contact with an object and further which sensor is in contact are sensed.

It is thereby possible to sense in which position and with what strength the robot is in contact with the object.

CITATION LIST

Non Patent Literature

[PTL 1] Japanese Unexamined Patent Application Publication No. 2006-337315
[PTL 2] Japanese Unexamined Patent Application Publication No. 2007-10482
[PTL 3] Japanese Unexamined Patent Application Publication No. 2007-285784
[PTL 4] Japanese Unexamined Patent Application Publication No. 2007-78382
[PTL 5] Japanese Unexamined Patent Application Publication No. 2006-287520
[PTL 6] Japanese Unexamined Patent Application Publication No. 2006-281347
[PTL 7] Japanese Patent No. 03621093

SUMMARY OF INVENTION

Technical Problem

The existing tactile sensor systems have the following problems.

In the technology disclosed in Patent Literature 1 to Patent Literature 6, the control unit, acting as a host, manages a large number of tactile sensor elements in a concentrated manner, sequentially selects the tactile sensor elements, and performs sampling of sensor values of the respective sensors.

In this structure, there is a problem that the processing load on the control unit becomes excessive with an increase in the number of sensors.

Further, the sampling interval becomes large with an increase in the number of sensors. This inevitably causes a decrease in the response speed to become slow to respond, which is a critical problem for the tactile sensor system of a robot.

Further, when thought is given to placing a large number of tactile sensors on the whole body surface of a robot, the number of lines between the tactile sensors and the control unit is enormous.

Thus, it is practically very difficult to mount a large number of tactile sensors at desired positions, and its maintenance and failure repair are extremely difficult.

Furthermore, because the lines between the tactile sensors and the control unit are long, a sensor signal is likely to be degraded due to noise.

In light of the above, one approach is to incorporate a sensor structure and a signal processing unit into each single tactile sensor.

Then, the signal processing unit can sense and amplify a sensor signal from the sensor structure and further perform digital processing.

To achieve this, technology to integrate the sensor structure and the signal processing unit is required.

For example, packaging technology called Shell Case is disclosed in Japanese Patent No. 03621093 (Patent Literature 7).

In Japanese Patent No. 03621093, a device chip is interposed between upper and lower glass plates, and its side is surrounded by resin.

In this structure, a plurality of wafers can be bonded together, and the device chip is securely protected with the glass plates.

However, according to the technology of Japanese Patent No. 03621093, the upper and lower faces of the device chip need to be adhered to glass. This causes a problem that it is not applicable to tactile sensors that need to come into contact with a detection target, such as a pressure-sensitive sensor and a temperature sensor, for example.

In view of the above circumstances, technology to incorporate a sensor structure having a contact sensing surface and a signal processing LSI that processes a sensor signal into package is desired.

Solution to Problem

A sensor device according to the present invention includes a sensor structure including a contact sensing surface that comes into direct contact with a detection target on one surface exposed outside and a sensor electrode that outputs an analog sensor signal upon sensing a change in the contact sensing surface at another surface side on an opposite side of the contact sensing surface, a semiconductor substrate including an embedded signal processing integrated circuit that processes the analog sensor signal, and a bonding layer interposed between said another surface of the sensor structure and the semiconductor substrate to bond the sensor structure and the semiconductor substrate together, wherein the sensor structure and the semiconductor substrate are stacked into a single chip with the sensor electrode and the integrated circuit placed opposite to each other with the bonding layer interposed therebetween, the sensor electrode and the integrated circuit are sealed inside the sensor device, and the sensor electrode and at least any of external terminals of the signal processing integrated circuit are led out to a back surface of the semiconductor substrate through a side surface of the semiconductor substrate.

A method for fabricating a sensor device according to the present invention includes placing a sensor electrode on a back surface of a wafer to serve as a sensor structure, producing a semiconductor substrate with an embedded signal processing integrated circuit, bonding the sensor structure and the semiconductor substrate together by a bonding layer with the sensor electrode and the integrated circuit placed opposite to each other, etching a back surface of the semiconductor substrate and performing half-dicing of the semiconductor substrate from the back surface to make a line draw-out portion of the sensor electrode and an electrode draw-out portion of the integrated circuit exposed at a back side of the semiconductor substrate, placing a lead line from an inclined surface to the back surface of the semiconductor substrate formed by the etching and the half-dicing, and leading out the sensor electrode and an external terminal of the signal processing integrated circuit to the back surface of the semiconductor substrate through a side surface of the semiconductor substrate.

DESCRIPTION OF EMBODIMENTS

Figure 1:
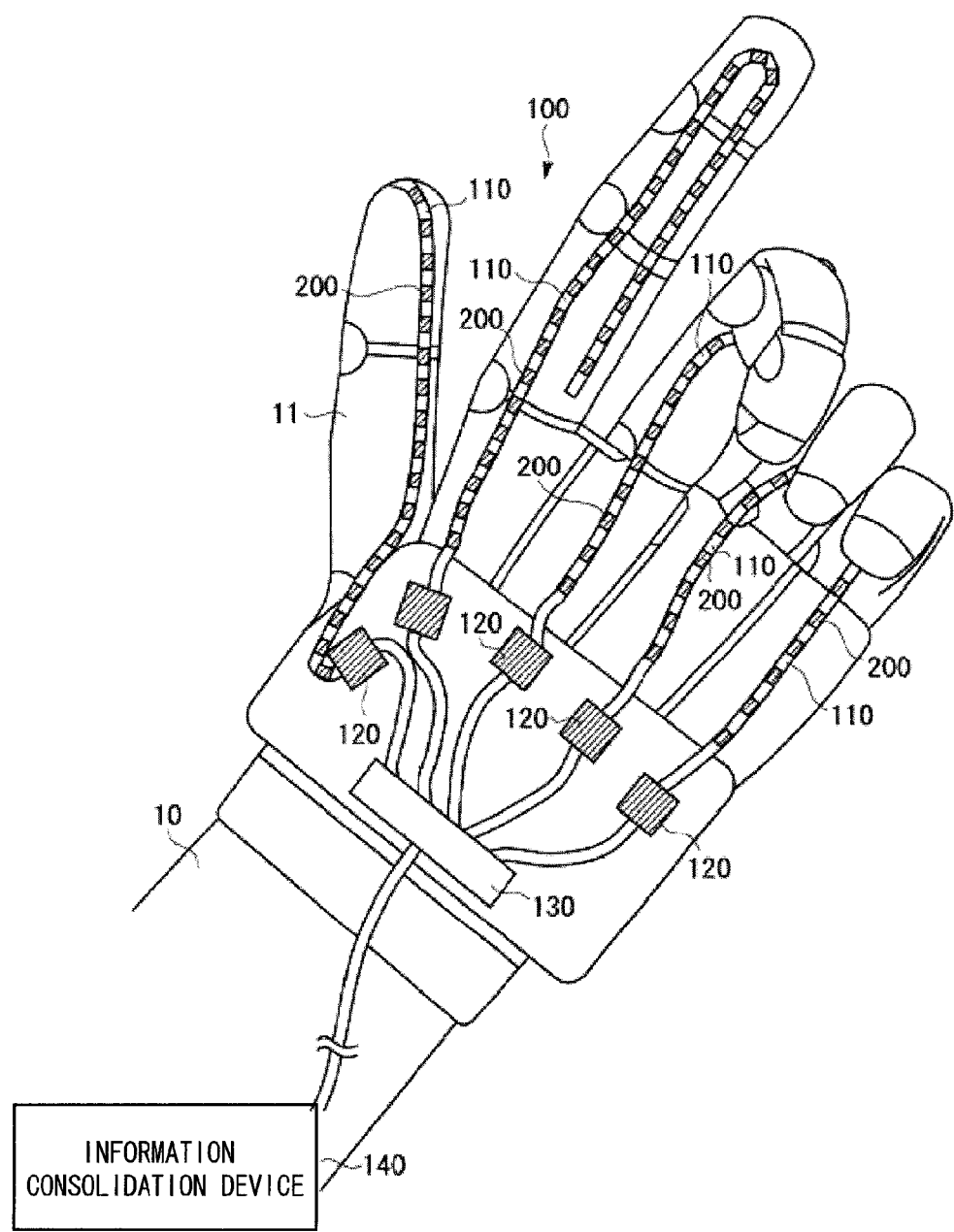
FIG. 1 is a view showing a tactile sensor system applied to a robot hand.

Embodiments of the present invention are illustrated in drawings and described with reference to the reference numerals assigned to elements in the drawings.
(First Embodiment)

A first embodiment of the sensor device according to the present invention is described hereinbelow.

FIG. 1 is a view showing the way a tactile sensor system in which a large number of sensor devices are mounted is applied to a robot hand.

Figure 2:
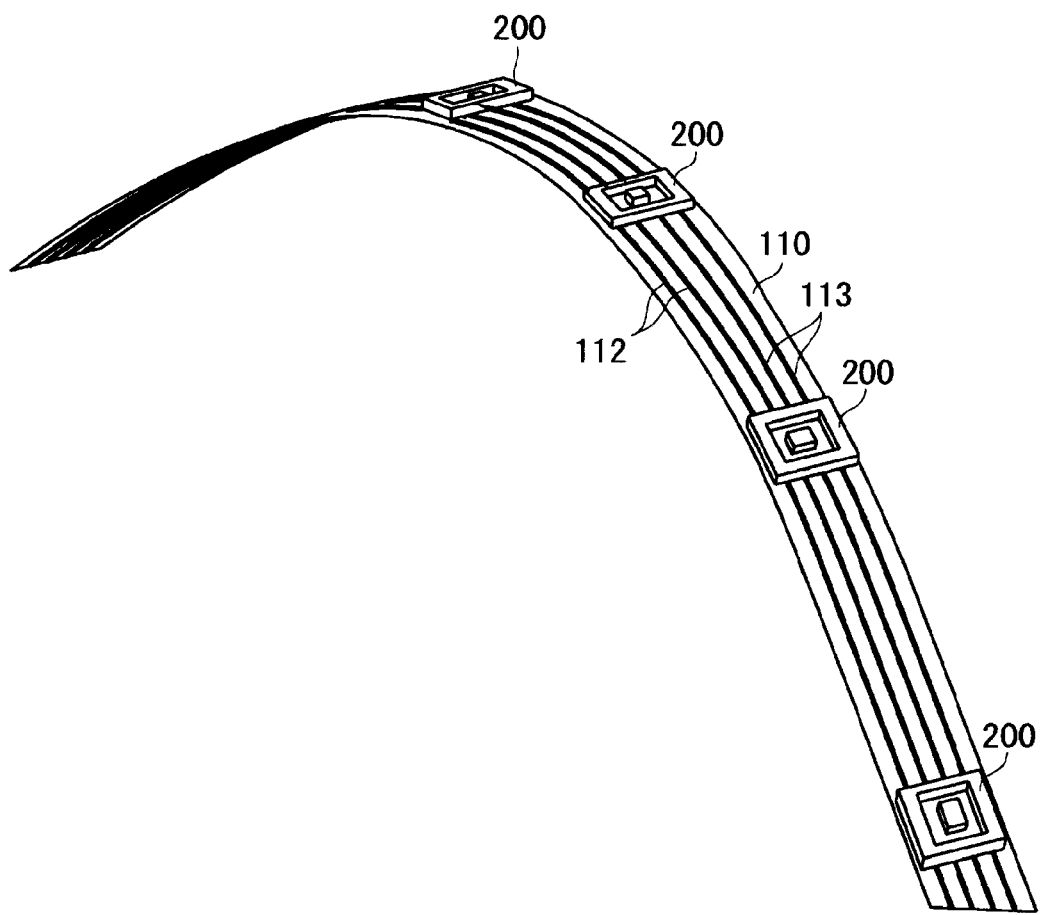
FIG. 2 is a view showing a plurality of sensor devices mounted on a bus.

FIG. 2 is a view showing the way a plurality of sensor devices 200 are mounted on a bus 110.

Sensor devices according to this embodiment are mounted on a hand 11 of a robot 10 as shown in FIG. 1 or on the whole body surface of a robot, thereby constituting a tactile sensor system 100 as a whole.

A plurality of tactile sensor devices 200 are mounted on each bus 110.

In this embodiment, four lines 112, 112, 113 and 113 are provided as wiring lines of the bus 110.

Two of the four lines are power supply lines 112 and 112, and the other two are signal lines 113 and 113 for differential serial transmission.

Then, all buses 110 are connected to an information consolidation device 140 through an information relay device 120 and a line concentration device 130.

When the hand 11 of the robot 10 grasps an object (not shown), for example, and the surface of the robot 10 comes into contact with the object, each of the sensor devices 200 senses a contact pressure.

Further, each of the sensor devices 200 executes digital signal processing of a sensor signal.

Then, the digital-processed sensor signal is transmitted from each of the sensor devices 200 to the information consolidation device 140.

The information consolidation device 140 consolidates the information from the sensor devices 200 and detects how much force is exerted on which position.

A structure of the sensor device is described hereinbelow.

Figure 3:
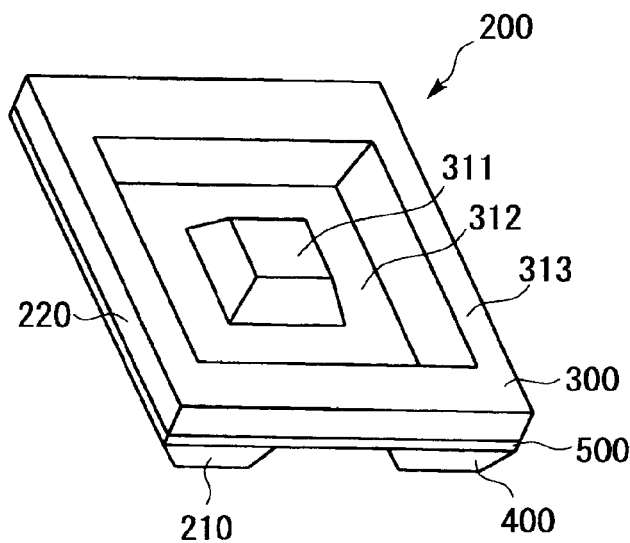
FIG. 3 is a perspective view of a sensor device viewed from the front side.

FIG. 3 is a perspective view of the sensor device viewed from the front side.

Figure 4:
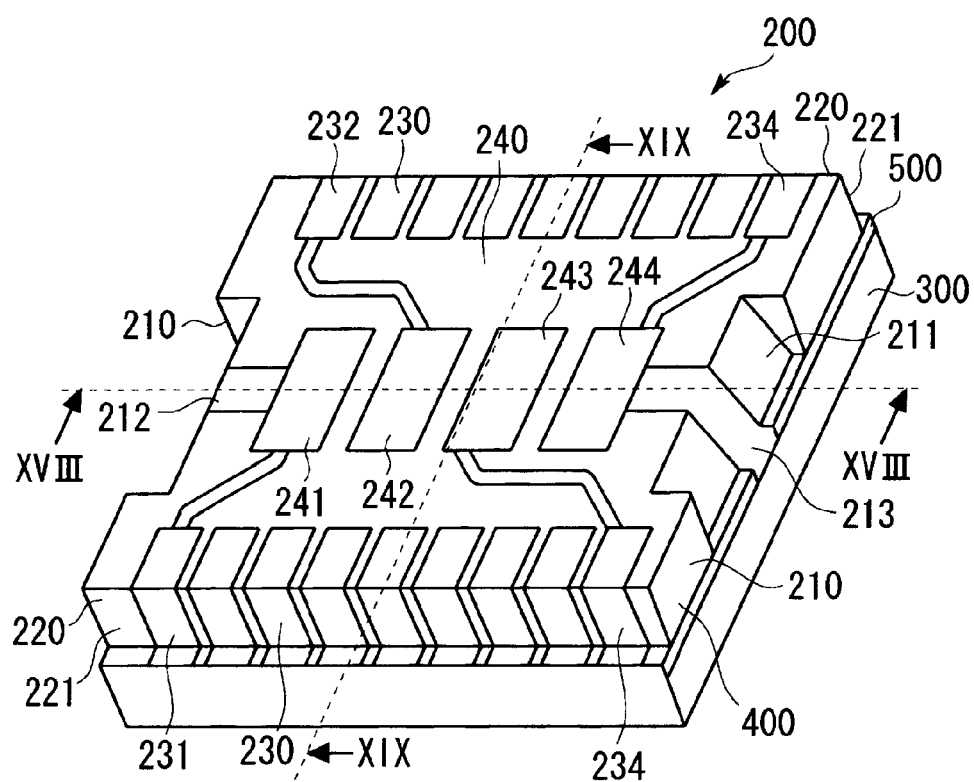
FIG. 4 is a perspective view of a sensor device viewed from the back side.

FIG. 4 is a perspective view of the sensor device viewed from the back side.

Figure 5:
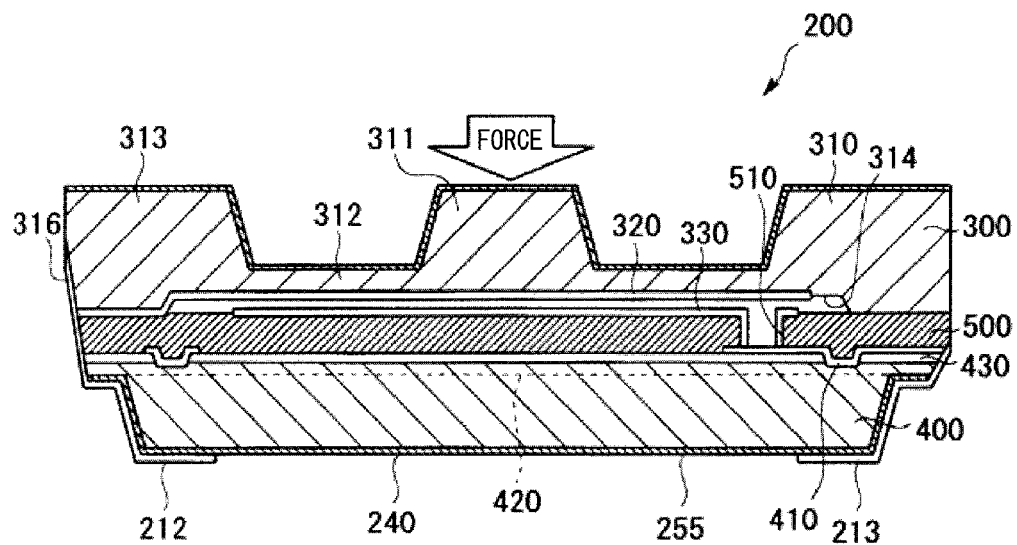
FIG. 5 is a cross-sectional view of a sensor device.

FIG. 5 is a cross-sectional view of the sensor device.

As shown in FIG. 5, the sensor device 200 has a structure in which a sensor structure 300 and a semiconductor substrate 400 are bonded together by a bonding layer 500.

The sensor structure 300 includes a structure main body 310, a first sensor electrode 320, and a second sensor electrode 330.

The structure main body 310 is made of Si.

When viewed from the front side, a raised force transfer portion 311 that comes into contact with an object is placed at the center of the structure main body 310, and the force transfer portion 311 is surrounded by a recessed thin portion 312.

The thin portion 312 is elastic, so that the structure main body 310 functions as a working film. Specifically, the structure main body 310 bends when a force acts on the force transfer portion 311.

The force transfer portion 311 forms a contact sensing surface.

The edge on the periphery of the thin portion 312 is a support frame portion 313 that supports the working film.

Further, a recessed portion 314 is formed on the back surface of the structure main body 310.

The first sensor electrode 320 is mounted on the recessed portion 314 that is formed on the back surface of the structure main body 310.

At least one end of the first sensor electrode 320 extends to the position reaching a side surface 316 of the structure main body 310 through the back surface of the support frame portion 313.

The first sensor electrode 320 is a movable electrode that is displaced together with the working film.

The second sensor electrode 330 is mounted immediately above the bonding layer 500.

The distance between the first sensor electrode 320 and the second sensor electrode 330 is determined by the depth of the recessed portion 314.

The second sensor electrode 330 is a fixed electrode, and the first sensor electrode 320 and the second sensor electrode 330 placed opposite to each other constitute a capacitor.

The second sensor electrode 330 is connected to a rewiring layer 410 of the semiconductor substrate 400 through a via 510 in the bonding layer 500.

A signal processing integrated circuit 420 is embedded in the semiconductor substrate 400, and its surface is covered with a passivation film 430.

Further, the rewiring layer 410 is placed on the passivation film 430.

The bonding layer 500 is placed immediately above the semiconductor substrate 400, and the second sensor electrode 330 and the integrated circuit 420 is placed opposite to each other with the bonding layer 500 interposed therebetween.

Further, the first and second sensor electrodes 320 and 330 and the integrated circuit 420 are sealed inside the sensor device 200.

The bonding layer 500 preferably has a thickness of 10 um or more to reduce the parasitic capacitance between the integrated circuit 420 and the sensor electrode 330.

Although the upper limit of the thickness is not particularly set, the thickness may be up to 100 μm, for example, taking the convenience of fabrication of a semiconductor chip or the like into account.

When the sensor device 200 is viewed from the back side, an inclined surface 211 is formed at the center of each of the side end surfaces in the horizontal direction of FIG. 4.

Then, metal lead lines 212 and 213 are formed on the inclined surfaces 211, and the lead lines 212 and 213 are led out to a back surface 240.

One lead line 212 is connected to one end of the first sensor electrode 320, and the other lead line 213 is connected to the second sensor electrode 330 through the rewiring layer 410 (see FIG. 5).

Further, side end surfaces 220 and 220 in the vertical direction of FIG. 4 are entirely formed as inclined surfaces 221 and 221, respectively, and nine lead lines 230 each are mounted to reach the back surface 240 on each of the side end surfaces 220 and 220.

The lead lines 230 are led out from the rewiring layer 410 and serve as power supply lines or signal lines of the integrated circuit 420.

On the back surface 240 of the sensor device 200 shown in FIG. 4, external connection terminals are mounted.

In this embodiment, four external terminals 241 to 244, corresponding to four wiring lines 112 and 113 of the bus 110, are mounted on the back surface of the sensor device 200.

In FIG. 4, a first external terminal 241, a second external terminal 242, a third external terminal 243 and a fourth external terminal 244 are shown sequentially from the left.

The first external terminal 241 is an external terminal that is connected to GND of the bus 110, for example, and the lead line 212 from a left side surface 210 and a lead line 231 at the leftmost of a lower side surface 220 are connected to the first external terminal 241.

A lead line 232 at the leftmost of an upper side surface 220 is connected to the second external terminal 242, and a lead line 234 at the rightmost of the lower side surface 220 is connected to the third external terminal 243.

The lead line 213 from a right side surface 210 and a lead line 234 at the rightmost of the upper side surface 220 are connected to the fourth external terminal 244.

Note that the number of external terminals 241 to 244 is varied as appropriate according to the number of signal lines, and connections between the lead lines and the external terminals may be varied as appropriate according to the structure of the sensor structure 300 and the integrated circuit 420 as a matter of course.

A fabrication method for a sensor device is described hereinbelow.

FIGS. 6 to 21 are views showing a fabrication procedure for a sensor device.

First, a wafer 315 to serve as the structure main body 310 of the sensor structure 300 is produced.

Figure 6:
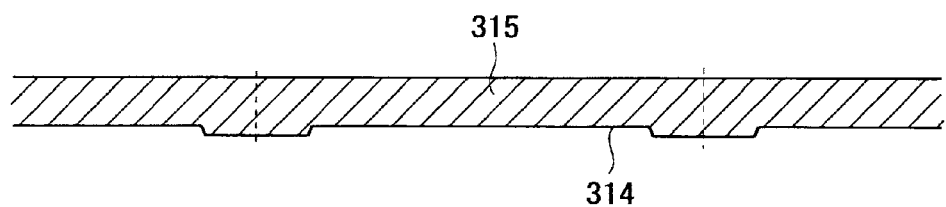
FIG. 6 is a view showing a fabrication process for a sensor device according to a first embodiment.
Figure 7:
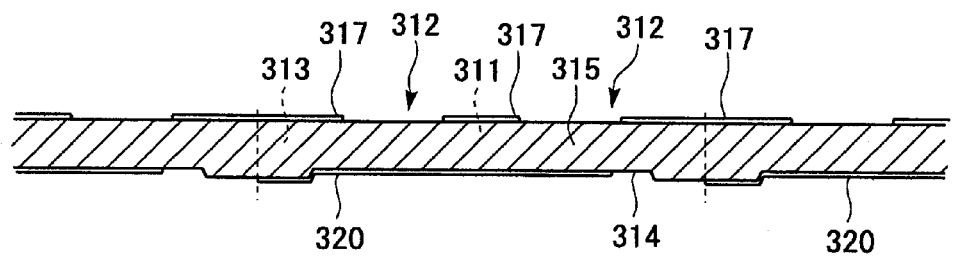
FIG. 7 is a view showing a fabrication process for a sensor device according to the first embodiment.

Specifically, as shown in FIG. 6, the wafer 315 made of Si is prepared, and its back surface is etched by TMAH (Tetramethyl ammonium hydroxide) to form the recessed portion 314 having a depth of about 10 μm. Then, as shown in FIG. 7, the first sensor electrode 320 is formed in the recessed portion 314. Further, on the surface of the Si wafer 315, a mask 317 for allowing an area other than the force transfer portion 311 and the support frame portion 313 to become the thin portion 312 is formed.

The mask 317 can be formed by a thermal oxide film.

Figure 8:
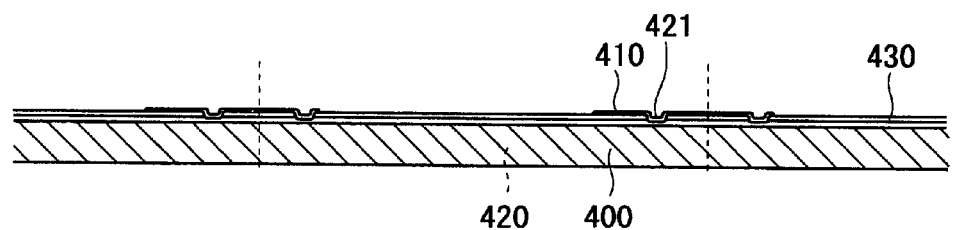
FIG. 8 is a view showing a fabrication process for a sensor device according to the first embodiment.

Further, on the other hand, as shown in FIG. 8, a wafer in which the signal processing integrated circuit 420 is embedded in the semiconductor substrate 400 is prepared.

Then, its surface is covered with the passivation film 430, and the rewiring layer 410 is placed on the passivation film 430.

The rewiring layer 410 is connected to an electrode pad 421 of the integrated circuit 420.

Figure 9:
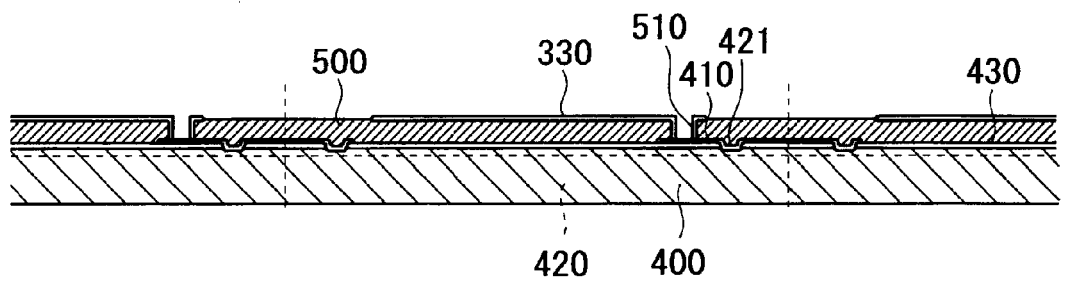
FIG. 9 is a view showing a fabrication process for a sensor device according to the first embodiment.

Next, as shown in FIG. 9, an organic insulating film as the bonding layer 500 is placed on the top surface of the semiconductor substrate 400, and further the second sensor electrode 330 is mounted on the bonding layer 500.

This process is described with reference to FIGS. 10(A) to (H).

As mentioned above, the semiconductor substrate 400 in which the integrated circuit 420 is embedded is prepared.

Figure 10A:
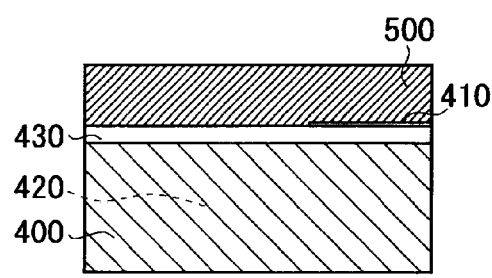
FIG. 10A is a view showing a fabrication process for a sensor device according to the first embodiment.

A BCB (Benzocyclobutene) resin film with a thickness of about 10 μm is formed thereon by spin coating (FIG. 10A).

The BCB (Benzocyclobutene) resin film becomes the bonding layer 500.

Then, precure is performed for the BCB resin film for one hour in a nitrogen purged oven at 220° C.

Figure 10B:
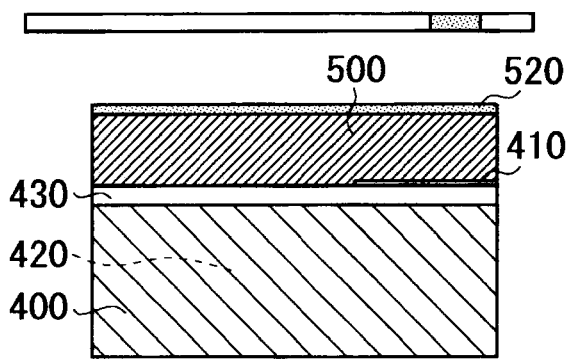
FIG. 10B is a view showing a fabrication process for a sensor device according to the first embodiment.
Figure 10C:
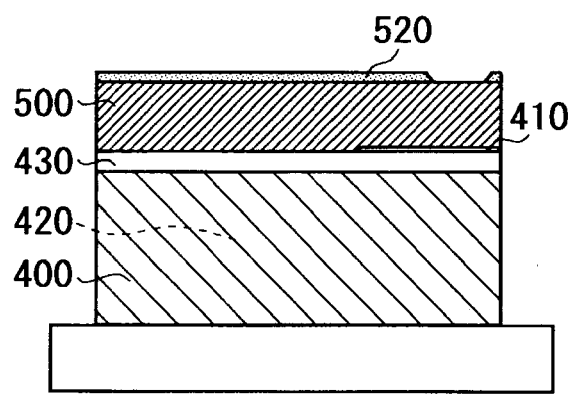
FIG. 10C is a view showing a fabrication process for a sensor device according to the first embodiment.

On the BCB film, a resist 520 is applied and exposed to light (FIG. 10B).

The resist 520 is cured by post-exposure bake (FIG. 10C), and then etched.

Figure 10D:
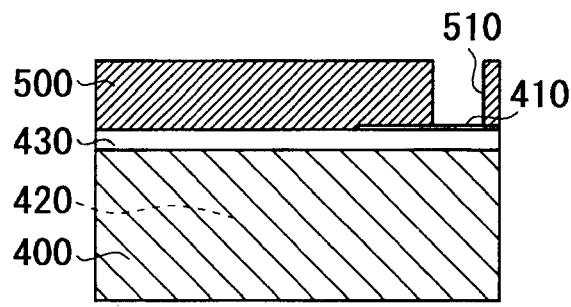
FIG. 10D is a view showing a fabrication process for a sensor device according to the first embodiment.

A via (hole) 510 is thereby formed immediately above the rewiring layer 410 (FIG. 10D).

Then, the semiconductor substrate 400 and the bonding layer 500 are hard-baked.

Figure 10E:
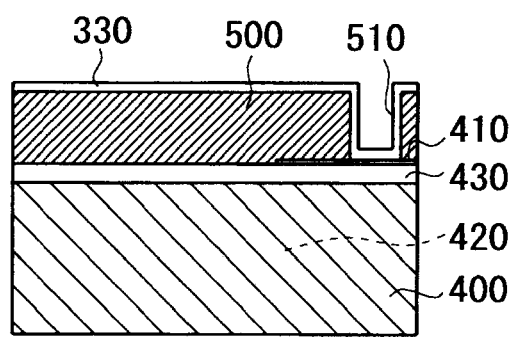
FIG. 10E is a view showing a fabrication process for a sensor device according to the first embodiment.

After that, aluminum (Al) is deposited by sputtering on the patterned bonding layer 500 (FIG. 10E).

The aluminum thin film becomes the second sensor electrode 330.

Figure 10F:
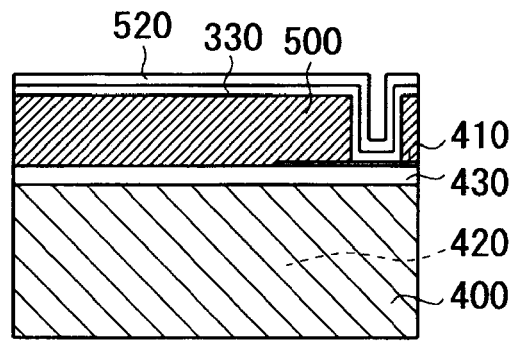
FIG. 10F is a view showing a fabrication process for a sensor device according to the first embodiment.
Figure 10G:
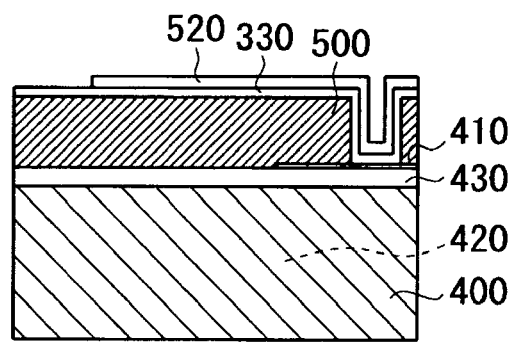
FIG. 10G is a view showing a fabrication process for a sensor device according to the first embodiment.

A resist 520 is applied onto the aluminum thin film and patterned (FIG. 10F, FIG. 10G).

Figure 10H:
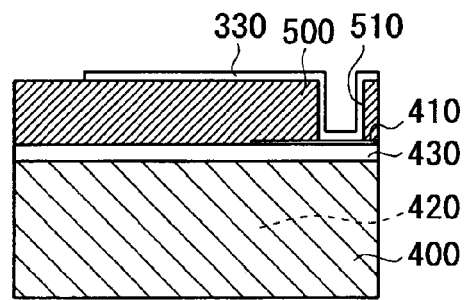
FIG. 10H is a view showing a fabrication process for a sensor device according to the first embodiment.

Then, the aluminum is etched (FIG. 10H).

The second sensor electrode 330 is thereby formed at the center excluding the peripheral part, and the second sensor electrode 330 is connected to the rewiring layer 410 of the integrated circuit 420 through the via 510.

Figure 11:
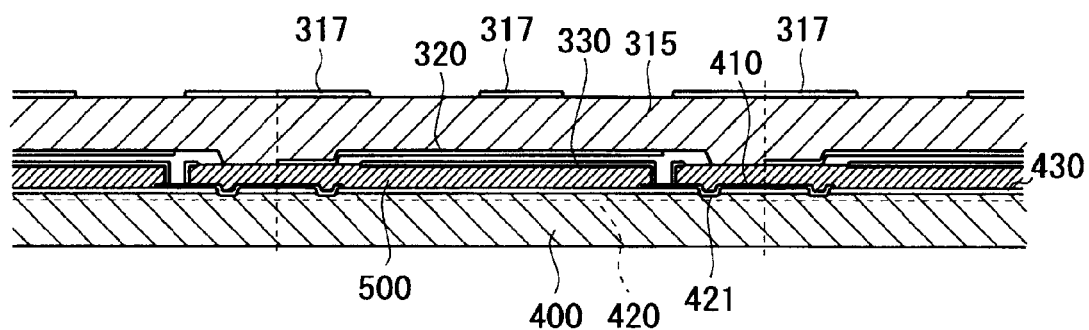
FIG. 11 is a view showing a fabrication process for a sensor device according to the first embodiment.

Then, the wafer 315 (FIG. 7) to become the structure main body 310 and the wafer (FIG. 9) to become the semiconductor substrate 400 are bonded as shown in FIG. 11.

For the bonding, a load of 1000N may be applied for one hour at 250° C., for example.

Figure 12:
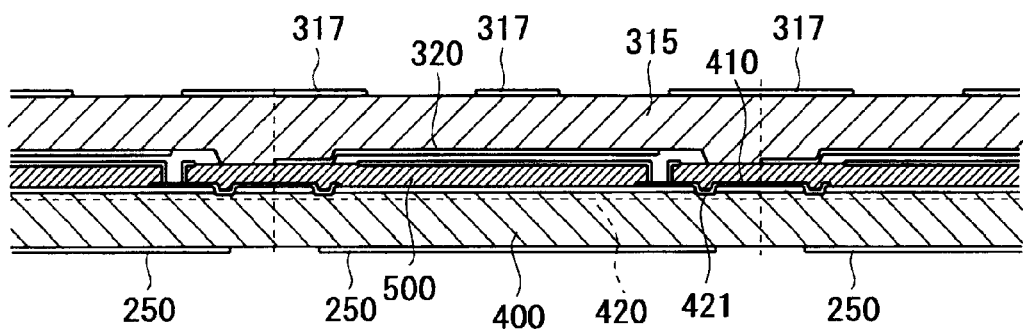
FIG. 12 is a view showing a fabrication process for a sensor device according to the first embodiment.

On the back surface of the semiconductor substrate 400, a protective film 250 for TMAH etching is formed (FIG. 12).

It is preferred to use a stack of a photosensitive alkali-resistant organic protective film (ProTEK PSB) on top of a low temperature oxide film deposited by PECVD or sputtering as the protective film 250.

Although a silicon thermal oxide film or a silicon nitride film is typically used as a mask material capable of resisting long etching of the Si substrate, those films require high temperature processing (800° C. or higher).

Such high temperature processing cannot be applied to the semiconductor substrate 400 in which the integrated circuit 420 is embedded.

Further, there is a problem that a pin hole occurs when using only a low temperature oxide film, and thus a side etching can occur if only the photosensitive alkali-resistant organic protective film is used.

Figure 13:
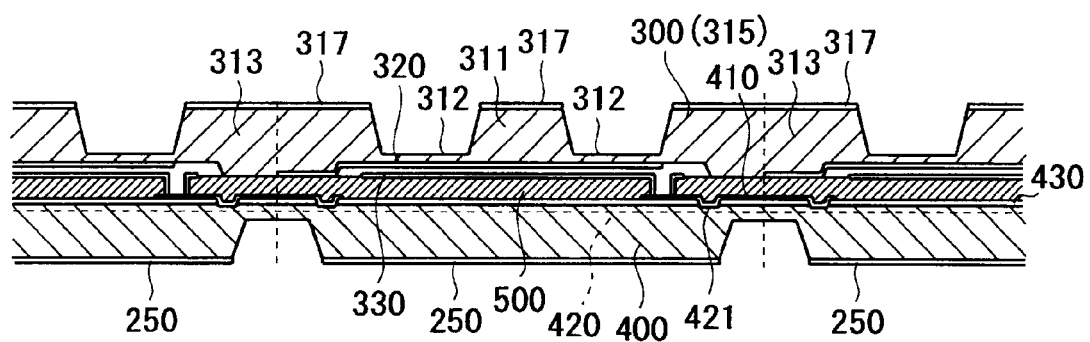
FIG. 13 is a view showing a fabrication process for a sensor device according to the first embodiment.

After forming the protective film 250, the both sides of the bonded wafers are etched (FIG. 13).

The semiconductor substrate 400 is thereby etched, and the thin portion 312 of the sensor structure 300 is formed at the same time.

Figure 14A:
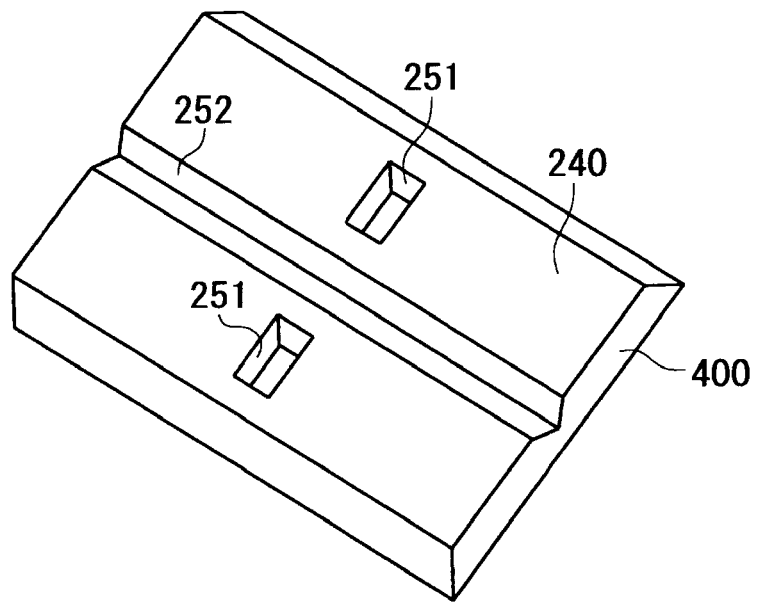
FIG. 14A is a view showing an opening pattern of a protective film.

Note that the opening pattern of the protective film 250 is preferably a hole 251 or a single groove 252 as shown in FIG. 14A.

Figure 14B:
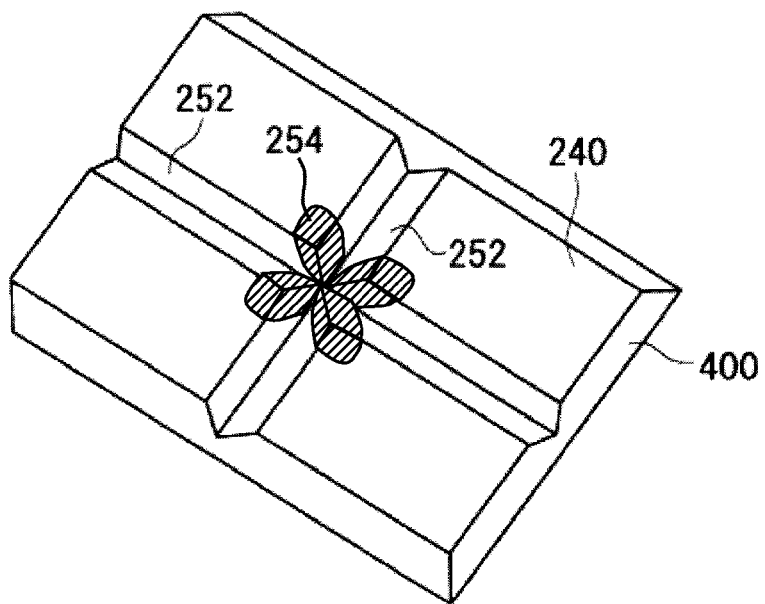
FIG. 14B is a view to explain a drawback when grooves cross each other.

If the grooves 252 and 252 cross each other as shown in FIG. 14B, for example, erosion of a corner 254 occurs quickly due to Si crystalline anisotropic etching using an alkaline solution (TMAH), which can cause damage to the integrated circuit 420 inside.

Figure 15:
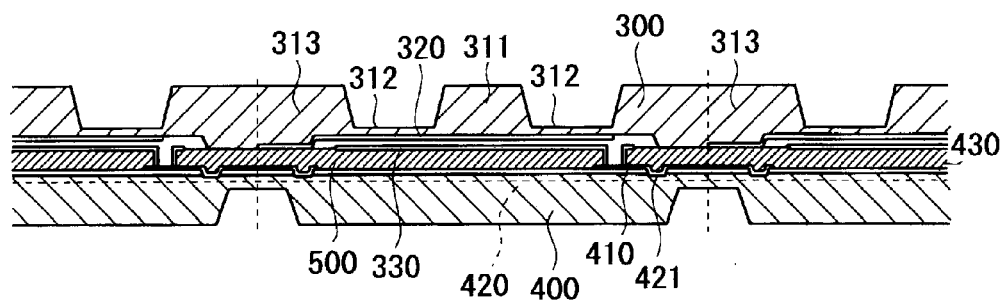
FIG. 15 is a view showing a fabrication process for a sensor device according to the first embodiment.

Etching is stopped when the thickness of about 10 μm from the electrode pad is left, and the photosensitive alkali-resistant organic protective film 250 is removed (FIG. 15).

Figure 16:
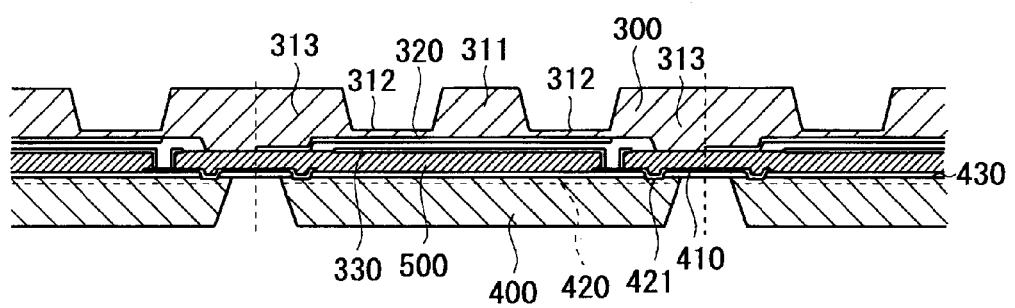
FIG. 16 is a view showing a fabrication process for a sensor device according to the first embodiment.

After that, isotropic etching by $XeF_2$ gas etching is performed to completely remove the Si substrate (FIG. 16).

Figure 17:
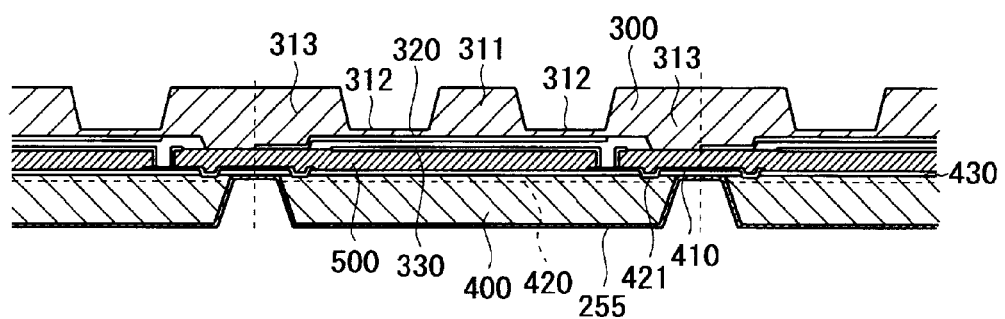
FIG. 17 is a view showing a fabrication process for a sensor device according to the first embodiment.

Then, a BCB resin is deposited as a base insulating film 255 (FIG. 17).

Figure 18:
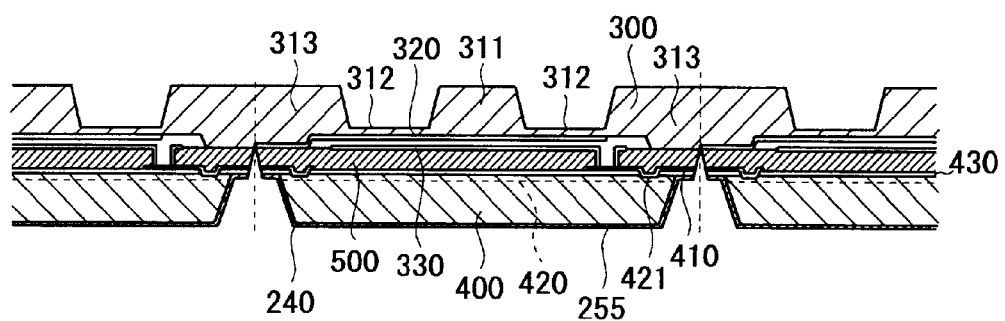
FIG. 18 is a view showing a fabrication process for a sensor device according to the first embodiment.

After the insulating film is applied, half-dicing is performed from the back surface of the semiconductor substrate using a V-blade (FIG. 18).

In FIG. 18, a cross section along line XVIII-XVIII of FIG. 4 is shown, and it is necessary to lead out the sensor electrodes 320 and 330 from the side surface of the sensor device 200 in this direction.

Accordingly, in half-dicing, it is necessary to cut up to the top surface of the bonding layer 500 so as to reach the first sensor electrode 320.

One end of the first sensor electrode 320 and the rewiring layer 410 are thereby exposed at the back surface 240 side from the left and right side surfaces.

Figure 19:
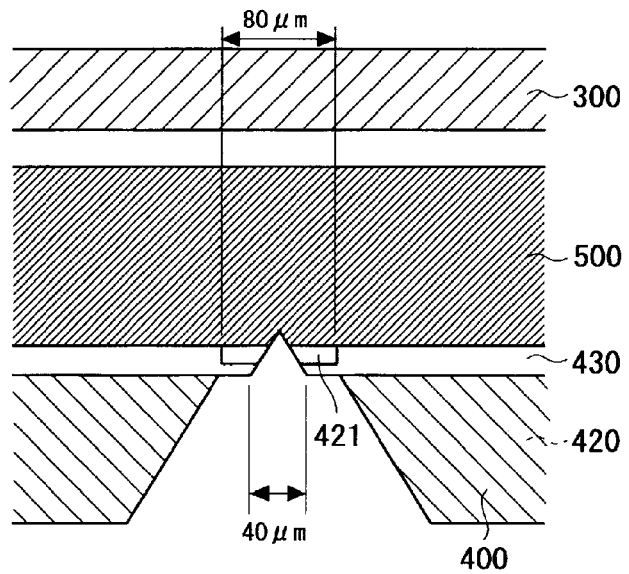
FIG. 19 is a view showing a fabrication process for a sensor device according to the first embodiment.

On the other hand, in the direction of a cross section along line XIX-XIX in FIG. 4, it is only necessary to lead out the electrode pad 421 of the integrated circuit 420, and therefore shallow half-dicing that reaches the electrode pad 421 or the rewiring layer 410 is enough as shown in FIG. 19.

Figure 20:
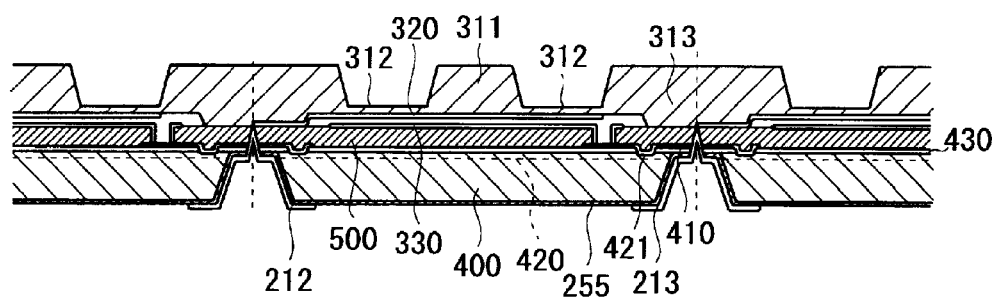
FIG. 20 is a view showing a fabrication process for a sensor device according to the first embodiment.

Then, wiring lines are formed by shadow masking (FIG. 20).

As a metal material, Ti/Cu may be used for example.

Ti functions as an intermediate layer for enhancing adhesiveness with the insulating film.

After that, electroless Au plating is performed on the lines to improve the wire bonding property.

Figure 21:
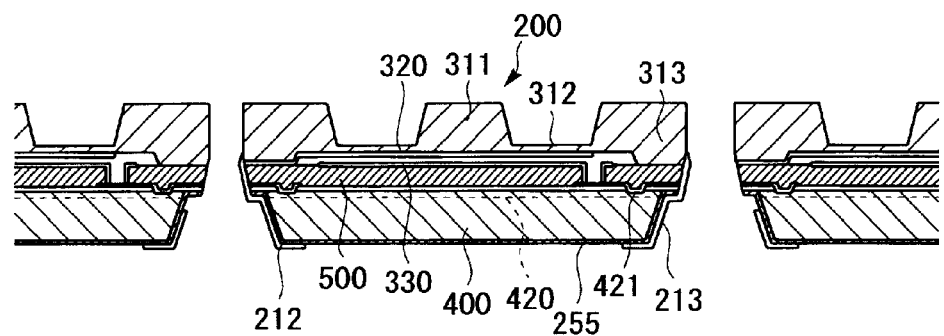
FIG. 21 is a view showing a fabrication process for a sensor device according to the first embodiment.

Finally, the wafer is divided by dicing, and each of the sensor devices 200 is cut therefrom (FIG. 21).

The following advantages are obtained by the first embodiment.

(1) By the fabrication method according to this embodiment, the tactile sensor devices 200 can be integrated at the wafer level.

In other words, the tactile sensor devices 200 can be configured as MEMS (Micro Electro Mechanical Systems) that integrally includes the sensor structure 300 and the integrated circuit 420.

Further, the tactile sensor devices 200 can be significantly miniaturized by the integration; for example, one tactile sensor device can be miniaturized to about 3 mm per side.

By producing MEMS that integrally includes the sensor structure 300 and the integrated circuit 420 and achieving militarization, it becomes suitable as a sensor system that is mounted on the body surface of the robot 10, for example.

(2) Although the accumulated electrical charge is read as an analog sensor signal from the sensor electrodes 320 and 330 by the integrated circuit 420, the analog sensor signal has a problem that the input impedance is high and the noise is likely to mix in.

With regard to this point, in this embodiment, the sensor electrodes 320 and 330 and the integrated circuit 420 are sealed inside the sensor, thereby completely protecting them.

Further, because the second sensor electrode 330 and the integrated circuit 420 are placed in very close proximity to each other with the bonding layer 500 interposed therebetween, the line length between the second sensor electrode 330 and the integrated circuit 420 can be very short. Thus, the noise is not likely to mix into the analog sensor signals from the sensor electrodes 320 and 330, which allows significant increase in detection accuracy.

(3) In the fabrication method according to this embodiment, because the sensor structure 300 and the semiconductor substrate 400 are bonded together by the bonding layer 500, no limitations are imposed on the structure of the integrated circuit 420 that is embedded in the semiconductor substrate 400.

For example, the semiconductor substrate 400 in which the existing sense amplifier and signal processing circuit are embedded may be applied to this embodiment.

(4) In this embodiment, because the sensor electrodes 320 and 330 and the integrated circuit 420 are sealed inside the sensor, it is necessary to draw out the electrodes to the outside.

To draw out the electrodes to the outside from the chip sealed inside the package, through-Si-vias (through-Si-lines) could be formed; however, providing the through-Si-vias of the same number as the number of wiring lines required causes a significant increase in the number of steps and the difficulty of processing.

With regard to this point, in this embodiment, the sensor electrodes and the electrodes of the integrated circuit are drawn out by etching and half-dicing from the back side of the semiconductor substrate.

It is thus possible to provide external terminals with a small number of steps and without difficulty.

(5) By diaphragm structure composed of the force transfer portion 311 and the thin portion 312, a force applied to the structure main body 310 is correctly reflected in the deformation of the structure main body 310.

Further, because the first sensor electrode 320 is formed directly on the back surface of the structure main body 310, the deformation of the structure main body 310 due to the external force received by the force transfer portion 311 can be converted into the displacement of the first sensor electrode 320, and the applied force can be sensed with high accuracy as a change in the capacitance of the capacitor formed together with the second sensor electrode 330.

(6) Because at least one end of the first electrode 320 extends to the position reaching the side surface 316 of the structure main body 310 through the back surface of the support frame portion 313, a direct connection can be made to an external power supply or circuit.

For example, if the first electrode 320 is connected to a ground electrode of an external power supply to be at the same voltage, the electrode located closest to the outside serves as the ground, thereby blocking external noise and enhancing the measurement accuracy.

Further, if electrical conduction is established between the first electrode 320 and the structure main body 310, the structure main body 310 is at the ground voltage, the capability to block external noise is further enhanced, and the S/N ratio is improved significantly.

(7) Because the first and second sensor electrodes 320 and 330 and the integrated circuit 420 are sealed inside the sensor device 200, the electrodes, lines and p-n junction in the sensor electrodes 320 and 330 and the integrated circuit 420 can be protected from corrosion, oxidation, degradation, conductive coating and the like due to the ingress of external moisture, acid, alkalis, organic solvent, oil solution, gas and the like, thereby achieving a stable operation over a long period.

The device can be thus provided with an organic coating dissolved in an organic solvent or operate under adverse conditions such as muddy water, worn on the hands or feet of the robot.

(8) Because the bonding layer 500 is placed on the passivation film 430 at the surface of the signal processing integrated circuit 420 embedded in the semiconductor substrate 400, and the second sensor electrode 330 is formed on top of the bonding layer 500, the length of the wiring line between the capacitor composed of the first sensor electrode 320 and the second sensor electrode 330 and the integrated circuit 420 is short.

Thus, the parasitic capacitance that serves as an important factor to affect the sensitivity and accuracy of the sensors decreases, thus improving the detection sensitivity.

Because the wiring length is short, noise is not likely to get mixed.

By increasing the thickness of the bonding layer 500, the parasitic capacitance between the integrated circuit 420 and the sensor electrode 330 further decreases, so that higher sensitivity can be obtained.

(9) The inclined surface 211 is at the center of each of the left and right side end surfaces and the inclined surface 221 is at the whole of each of the upper and lower side end surfaces 220, and the metal lead lines 212, 213 and 230 are formed on the respective inclined surfaces. By placing the lines 212, 213 and 230 on the inclined surfaces, fabrication is easy, the thickness of the lines is secured, and instability such as disconnection caused by step is eliminated.

By these shape and structure, stability to temperature and durability against repeated temperature change increase, and therefore the reliability of the lines upon mounting of the devices or during use is significantly improved.

The inclined surfaces 211 on the left and right side end surfaces have the shape that is formed only at the center of each of the left and right side end surfaces, which are different from the inclined surfaces on the upper and lower side end surfaces 220.

This is made with a view to address issues in fabricating the inclined surfaces; however, the reliability of the lines can be also improved by providing the inclined surface 211 that is slightly recessed than the inclined surface 211.

(10) The lines for the sensor electrodes 320 and 330 are the lead lines 212 and 213 formed on the inclined surfaces 211 at the left and right side ends, and the lines for the electrodes of the integrated circuit 420 are the lead lines 230, 231, 232 and 234 formed on the inclined surfaces 221 at the upper and lower side ends.

The depth of wedge cuts to draw out the lines for the sensor electrodes is larger than the depth of wedge cuts to draw out the lines for the integrated circuit.

The leading out of the lines in two different directions can be thereby performed stably.

(11) In this embodiment, the bonding layer 500 serves both as an insulating film and an adhesive material.

Thus, the bonding layer 500 needs to have stability as the insulating film and flexibility and adhesiveness as the adhesive material.

With regard to this point, in this embodiment, a BCB (Benzocyclobutene) resin film is used as the bonding layer, precure is performed at 220° C., and then the sensor electrodes are patterned.

Then, bonding between the sensor structure 300 and the semiconductor substrate 400 is performed at 250° C.

At this time, if a procure temperature is set lower, the flexibility and adhesiveness increase but a problem arises in the stability.

On the other hand, if a procure temperature is set higher, the stability increases but the adhesiveness and flexibility cannot be maintained, and, if a junction temperature is set higher to compensate for this, damage occurs to the sensor electrodes.

In this embodiment, those issues can be overcome, and the most suitable stability, flexibility and adhesiveness can be achieved.

(Second Embodiment)

A second embodiment is described hereinbelow.

In the first embodiment, the case where the second sensor electrode 330 is formed immediately above the bonding layer 500 placed on the semiconductor substrate 400 and then the structure main body 310 and the semiconductor substrate 400 are bonded together is described by way of illustration.

Figure 22:
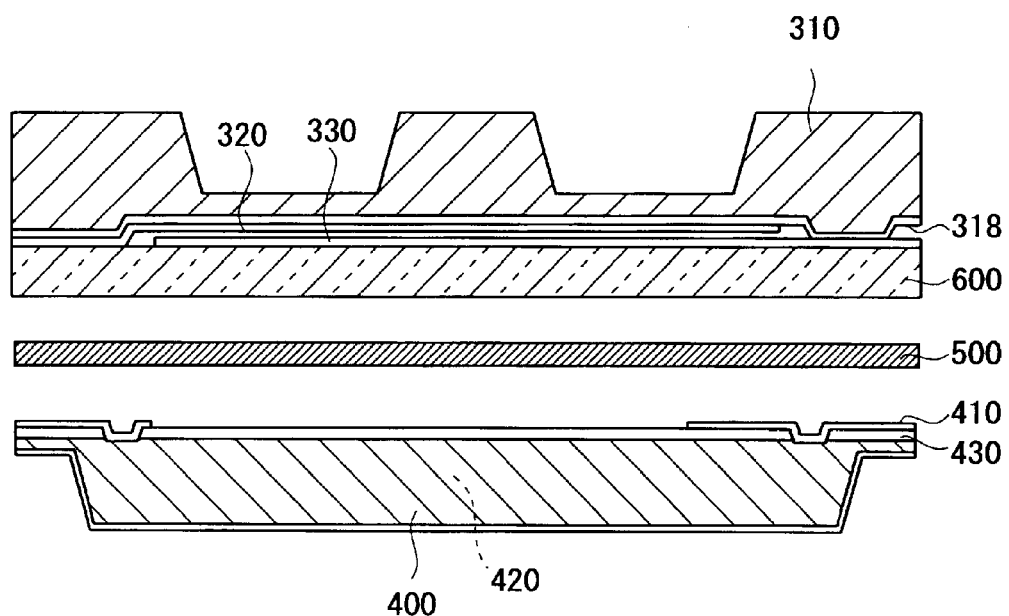
FIG. 22 is a view showing a structure of a second embodiment in an exploded fashion.

On the other hand, in the second embodiment, a glass substrate 600 on which the second electrode 330 is formed is bonded to the back surface of the structure main body 310, so that the electrodes 320 and 330 of the sensor structure 300 are sealed (FIG. 22).

After that, the semiconductor substrate 400 and the wafer of the sensor structure 300 are bonded together by the bonding layer 500.

FIGS. 23A to 23I are views showing a fabrication procedure according to the second embodiment.

Figure 23A:
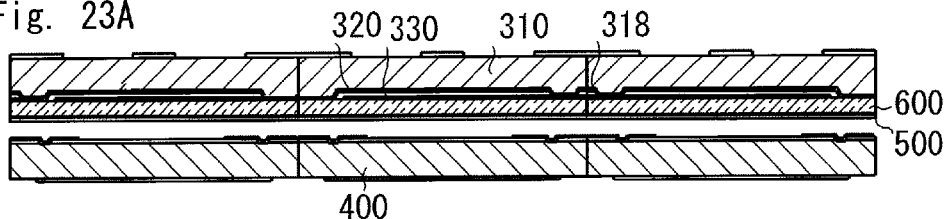
FIG. 23A is a view showing a fabrication process according to the second embodiment.
Figure 23B:
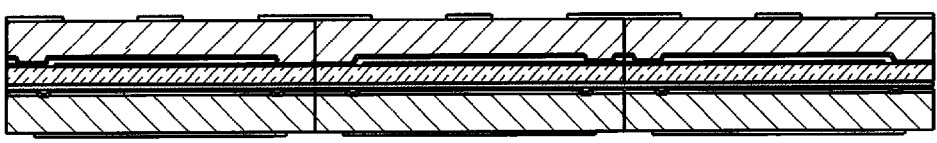
FIG. 23B is a view showing a fabrication process according to the second embodiment.
Figure 23C:
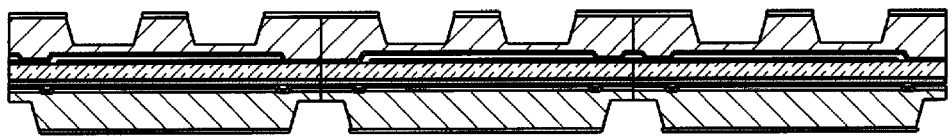
FIG. 23C is a view showing a fabrication process according to the second embodiment.
Figure 23D:
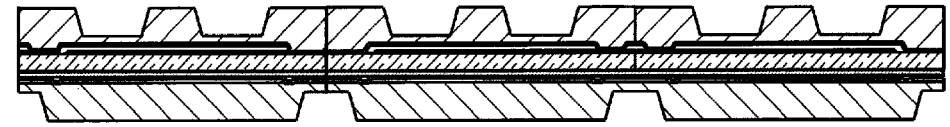
FIG. 23D is a view showing a fabrication process according to the second embodiment.
Figure 23E:
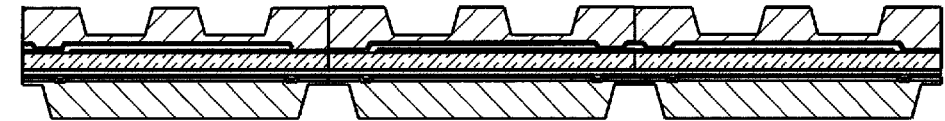
FIG. 23E is a view showing a fabrication process according to the second embodiment.
Figure 23F:
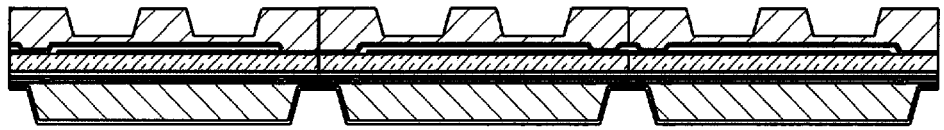
FIG. 23F is a view showing a fabrication process according to the second embodiment.

As shown in FIG. 23A, the wafer (FIG. 7) to serve as the structure main body 310 and the glass substrate 600 are bonded together.

At this time, the second sensor electrode 330 is formed on the glass substrate 600.

The first sensor electrode 320 and the second sensor electrode 330 are thereby sealed between the structure main body 310 and the glass substrate 600.

Note that, in FIG. 23A, in the wafer to serve as the structure main body 310, a groove 318 is made by etching at the position where dicing is to be executed on the side of the second sensor electrode 330 where lead lines are provided.

This prevents a dicing blade from cutting to the Si structure main body 310 during half-dicing.

Then, the bonding layer 500 is formed on the back surface of the glass substrate 600, and the glass substrate 600 and the semiconductor substrate 400 are bonded together.

Figure 23G:
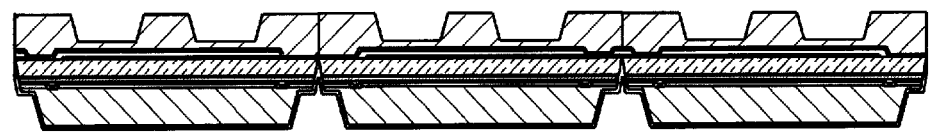
FIG. 23G is a view showing a fabrication process according to the second embodiment.
Figure 23H:
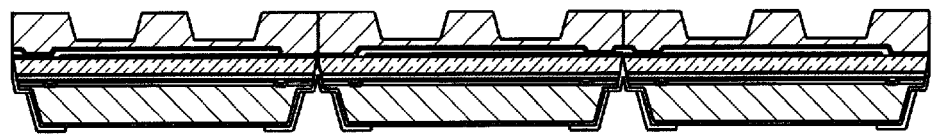
FIG. 23H is a view showing a fabrication process according to the second embodiment.
Figure 23I:
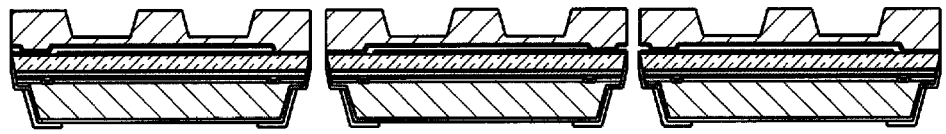
FIG. 23I is a view showing a fabrication process according to the second embodiment.

In FIG. 23G, half-dicing for allowing the sensor electrodes 320 and 330 to be exposed outside is executed.

At this time, it is necessary to cut up to the top surface of the glass substrate 600.

Figure 24:
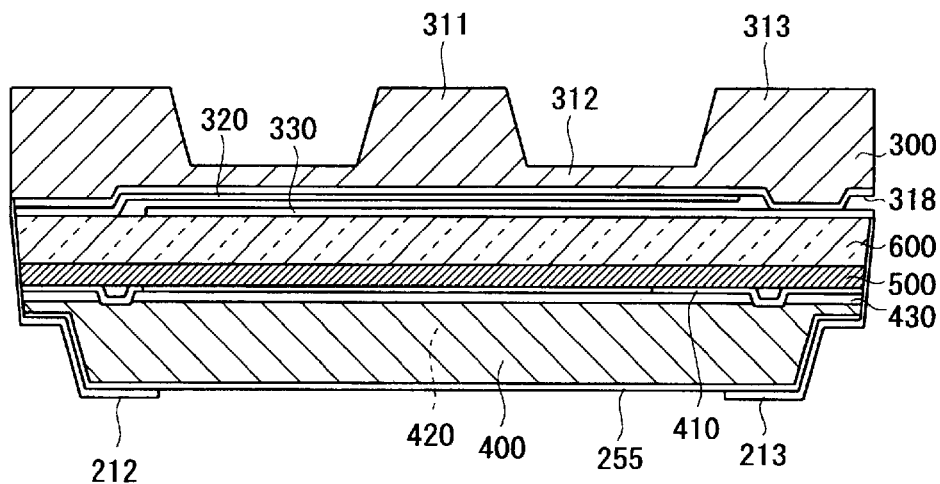
FIG. 24 is a view showing a structure of the second embodiment.

The other procedural steps are the same as those described in the first embodiment, and the sensor device shown in FIG. 24 is obtained finally.

In this structure, because the wafer (FIG. 7) to serve as the structure main body 310 and the glass substrate 600 are bonded together, the second sensor electrode 330 is formed on the glass substrate 600, and the first sensor electrode 320 and the second sensor electrode 330 are sealed between the structure main body 310 and the glass substrate 600, the shape, gap, and relative position of the first sensor electrode 320 and the second sensor electrode 330 can be set more accurately.

It is thereby possible to achieve highly accurate sensor performance.

(Third Embodiment)

A third embodiment is described hereinbelow.

In the above second embodiment, the case where the glass substrate 600 on which the second electrode 330 is formed is bonded to the back surface of the structure main body 310 to seal the electrodes 320 and 330 of the sensor structure 300, and then the semiconductor substrate 400 and the wafer of the sensor structure 300 are bonded together by the bonding layer 500 is described by way of illustration.

With regard to this point, the third embodiment is characterized in using a LTCC (Low Temperature Co-fired Ceramics) substrate 700 in placed of the glass substrate 600.

Figure 25:
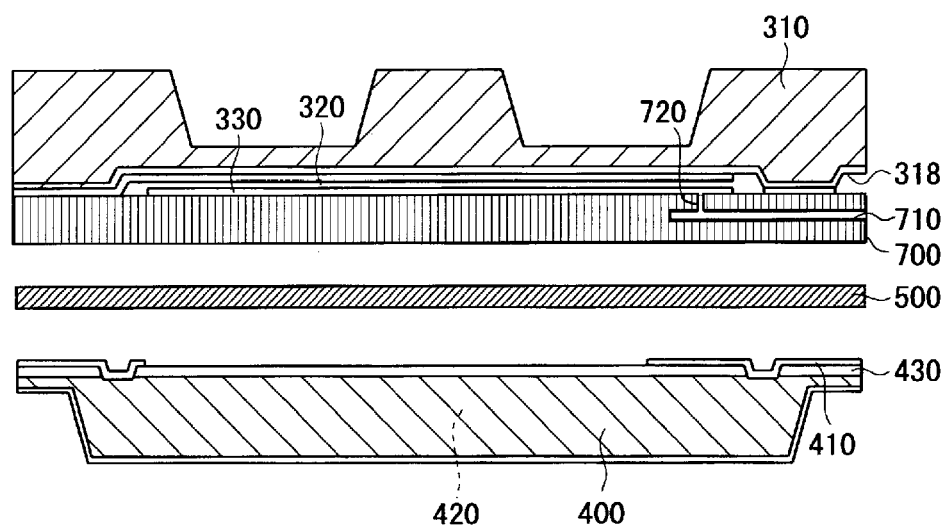
FIG. 25 is a view showing a structure of a third embodiment in an exploded fashion.

In FIG. 25, the second sensor electrode 330 is formed on the top surface of the LTCC substrate 700.

Further, a wiring layer 710 is embedded in the LTCC substrate 700, and the wiring layer 710 is connected to the second sensor electrode 330 through a via 720.

Thus, the lead lines of the second sensor electrode 330 can be led out from the wiring layer 710 of the LTCC substrate 700.

FIGS. 26 are views showing a fabrication procedure according to the third embodiment.

Figure 26A:
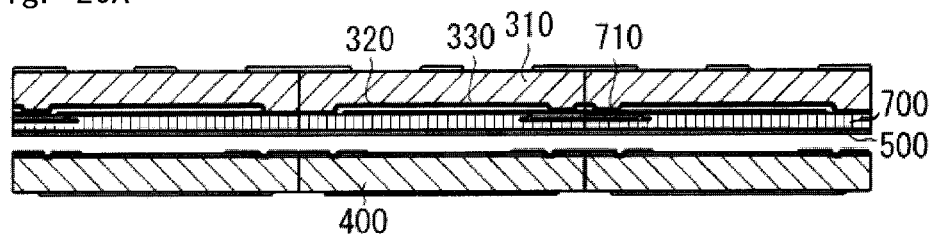
FIG. 26A is a view showing a fabrication process according to the third embodiment.
Figure 26B:
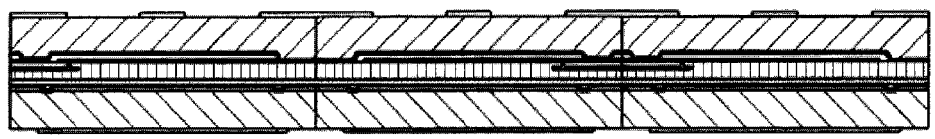
FIG. 26B is a view showing a fabrication process according to the third embodiment.
Figure 26C:
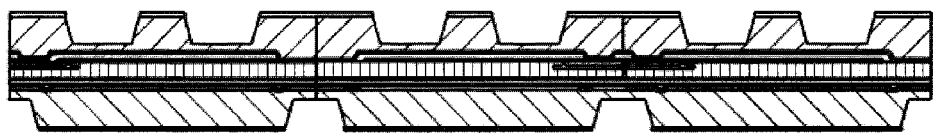
FIG. 26C is a view showing a fabrication process according to the third embodiment.
Figure 26D:
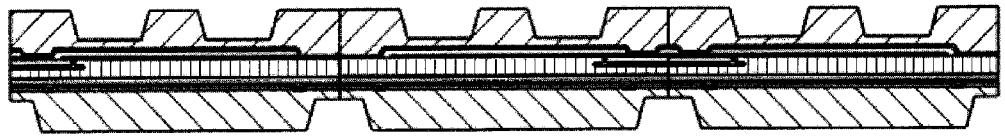
FIG. 26D is a view showing a fabrication process according to the third embodiment.
Figure 26E:
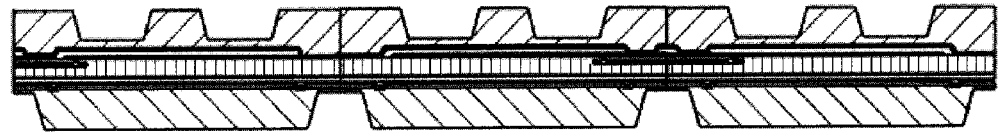
FIG. 26E is a view showing a fabrication process according to the third embodiment.
Figure 26F:
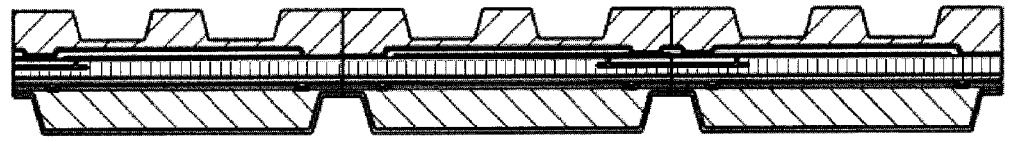
FIG. 26F is a view showing a fabrication process according to the third embodiment.

As shown in FIG. 26A, the wafer (FIG. 7) to serve as the structure main body 310 and the LTCC substrate 700 are bonded together.

At this time, the wiring layer 710 is embedded inside the LTCC substrate 700, and the second sensor electrode 330 formed on the top surface of the LTCC substrate 700 and the wiring layer 710 are connected.

At the stage of FIG. 26A, the first sensor electrode 320 and the second sensor electrode 330 are sealed between the structure main body 310 and the LTCC substrate 700.

Then, the bonding layer 500 is placed on the back surface of the LTCC substrate 700, and the LTCC substrate 700 and the semiconductor substrate 400 are bonded together.

Figure 26G:
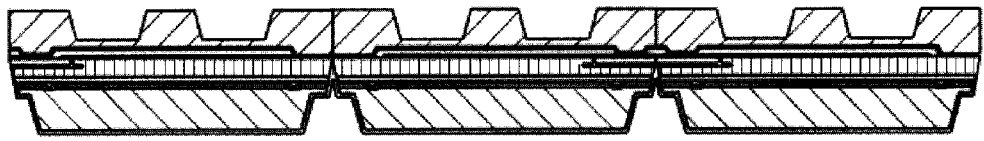
FIG. 26G is a view showing a fabrication process according to the third embodiment.
Figure 26H:
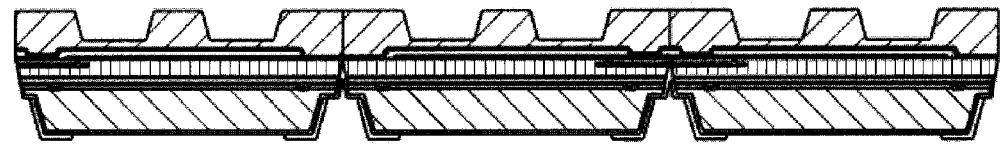
FIG. 26H is a view showing a fabrication process according to the third embodiment.
Figure 26I:
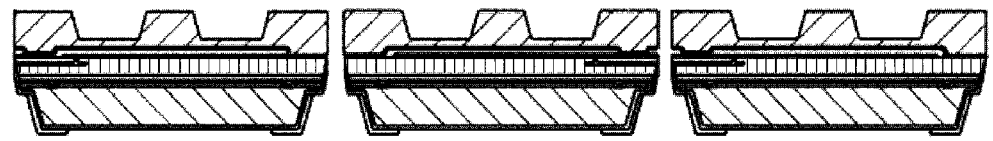
FIG. 26I is a view showing a fabrication process according to the third embodiment.

In FIG. 26G, half-dicing for allowing the sensor electrodes 320 and 330 to be exposed outside is executed.

At this time, it is necessary to cut up to the top surface of the LTCC substrate 700.

Figure 27:
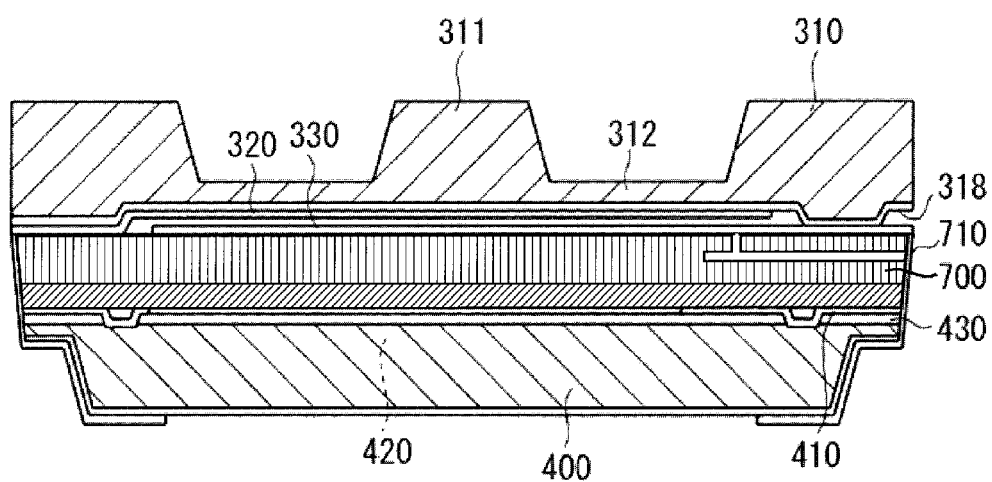
FIG. 27 is a view showing a structure of the third embodiment.

The other procedural steps are the same as those described in the first embodiment, and the sensor device shown in FIG. 27 is obtained finally.

Because the second sensor electrode 330 is formed on a ceramic substrate such as the LTCC substrate, for example, the shape, gap, and relative position of the first sensor electrode 320 and the second sensor electrode 330 can be set more accurately just like the case of using the glass substrate 600.

Further, because a multilayer interconnection, a capacitor, a coil, an interlayer electrode, an interlayer dielectric film and the like can be formed in the ceramic substrate 700, or passive electronic parts or active electronic parts such as a diode and a transistor can be incorporated between the layers, it is possible to effectively improve the sensor sensitivity or the S/N ratio in an analog manner by analog signal processing before digitization.

This significantly increases the functions, varieties and applicable scopes of the sensors.

(Fourth Embodiment)

Although the first and second sensor electrodes 320 and 330 are exposed outside by performing half-dicing in the first to third embodiments, the first and second sensor electrodes 320 and 330 are exposed outside by performing fast atom beam etching, accelerated ion etching or mechanical etching such as sandblasting on the passivation film (TEOS film, SiN film etc.) 430 after etching by TMAH in the fourth embodiment.

Figure 31:
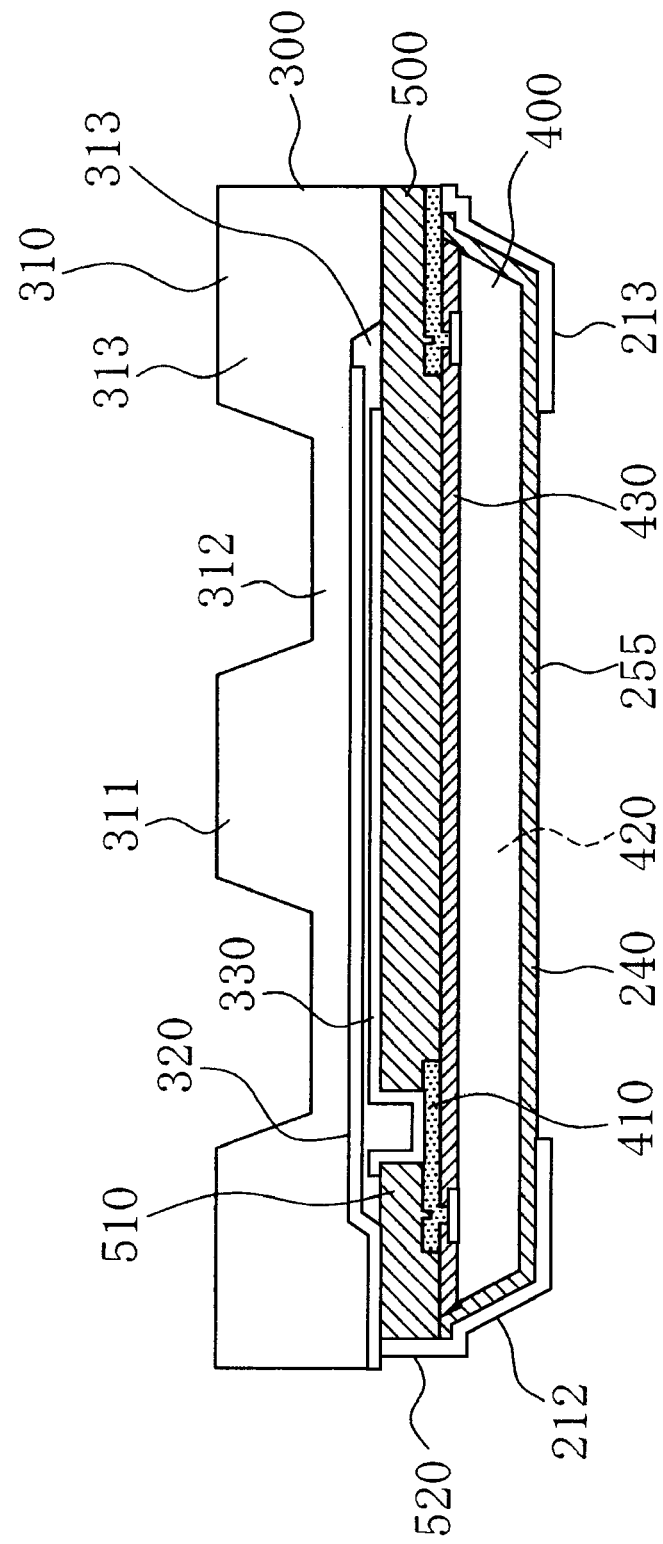
FIG. 31 is a cross-sectional view of a sensor device according to a fourth embodiment.

FIG. 31 is a cross-sectional view of the sensor device according to the fourth embodiment. As shown in FIG. 31, the bonding layer 500 has a via 510 to electrically connect the second sensor electrode 330 and the rewiring layer 410 of the semiconductor substrate 400, and a via 520 to electrically connect the first sensor electrode 320 and the back surface 240.

Figure 32:
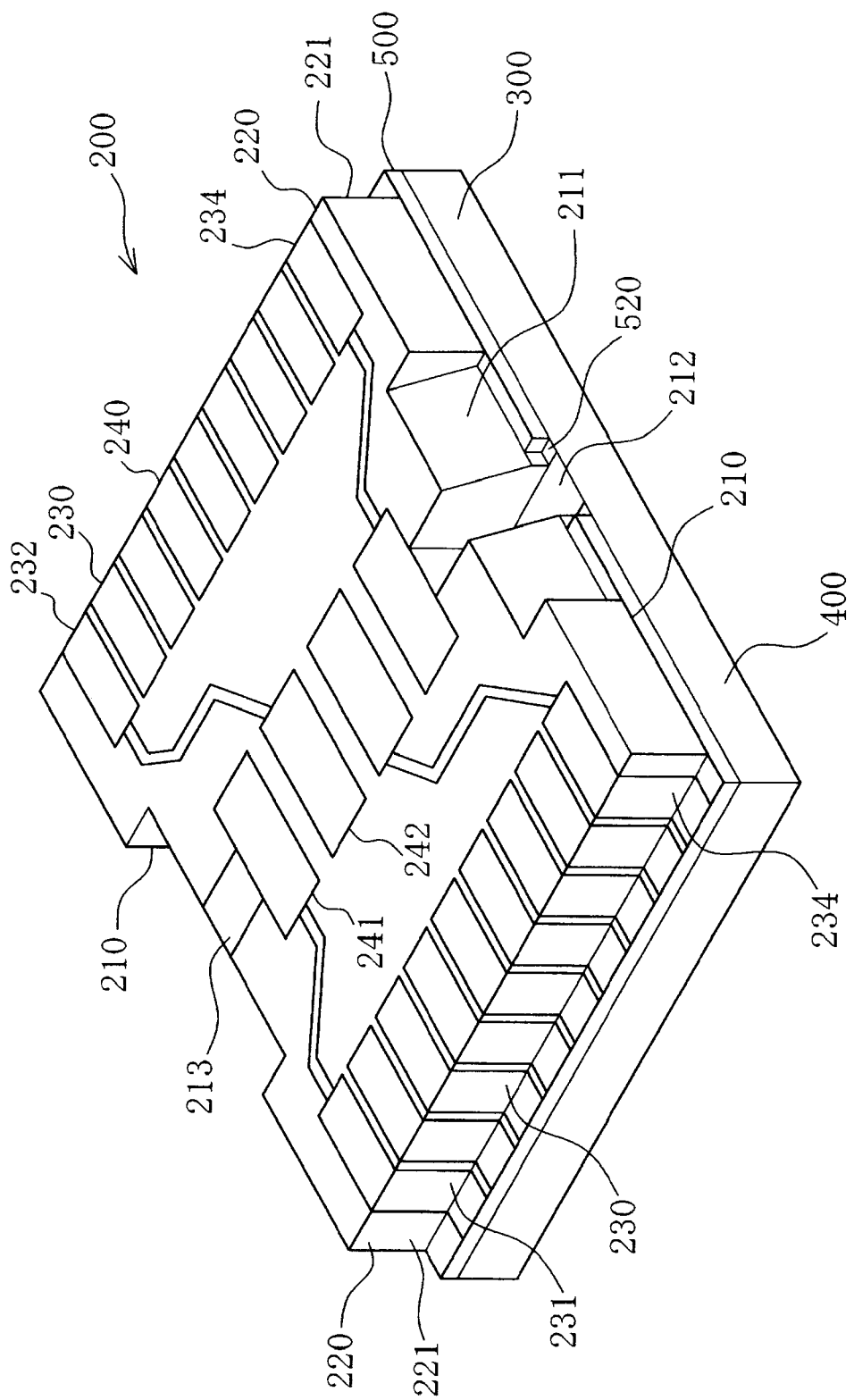
FIG. 32 is a perspective view of a sensor device according to the fourth embodiment viewed from the back side.

FIG. 32 is a perspective view of the sensor device according to the fourth embodiment viewed from the back side. As shown in FIG. 32, the first sensor electrode 320 on the back surface of the structure main body 310 is exposed through the via 520 and led out to the back surface 240 by the lead line 212 connected to the via 520.

FIGS. 33A to 33I are views showing a fabrication process according to the fourth embodiment. As shown in FIG. 32A, the wafer to serve as the structure main body 310 and the semiconductor substrate 400 on which the bonding layer 500 having the via 520 is formed are first bonded together and thinned (FIG. 32B).

Figure 33A:
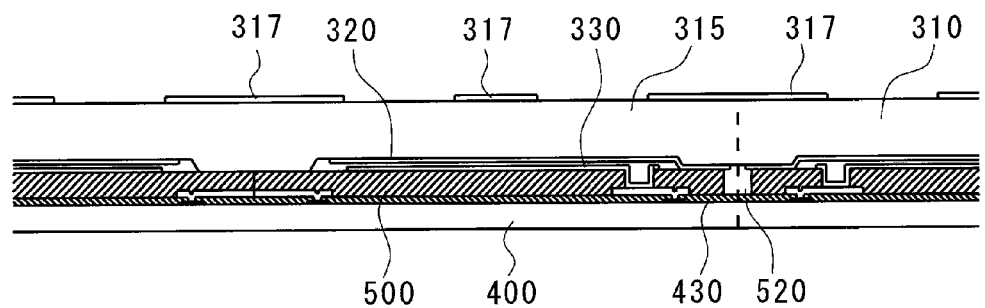
FIG. 33A is a view showing a fabrication process according to the fourth embodiment.
Figure 33B:
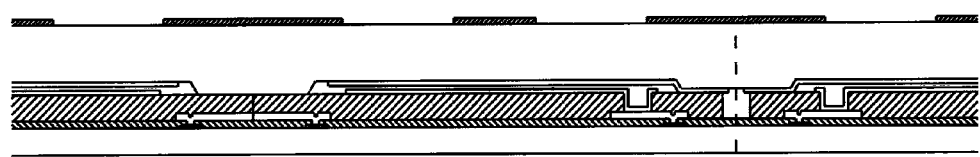
FIG. 33B is a view showing a fabrication process according to the fourth embodiment.
Figure 33C:
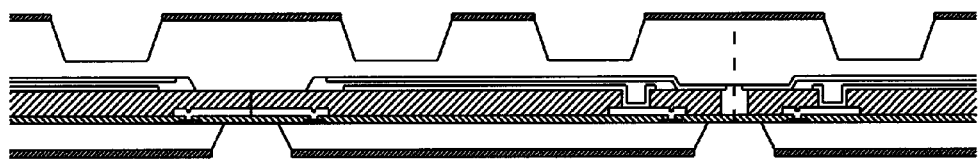
FIG. 33C is a view showing a fabrication process according to the fourth embodiment.
Figure 33D:
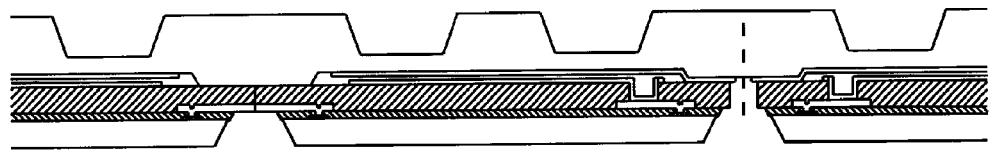
FIG. 33D is a view showing a fabrication process according to the fourth embodiment.

Next, the passivation film 430 is exposed by TMAH wet etching and $XeF_2$ dry etching (FIG. 33C). After that, etching is performed to remove the passivation film 430 as shown in FIG. 33D. As a result, the first and second sensor electrodes 320 and 330 are exposed outside at the same time by the presence of the via 520.

Figure 33E:
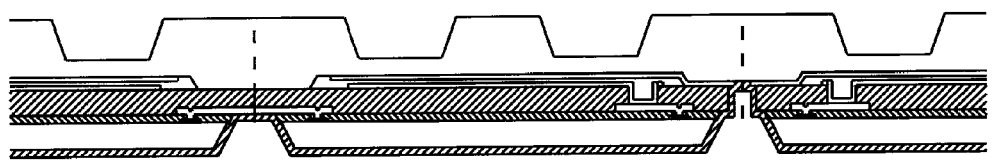
FIG. 33E is a view showing a fabrication process according to the fourth embodiment.
Figure 33F:
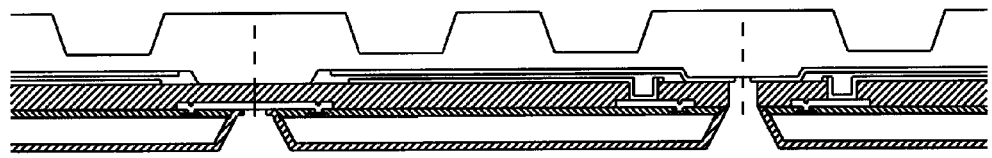
FIG. 33F is a view showing a fabrication process according to the fourth embodiment.
Figure 33G:
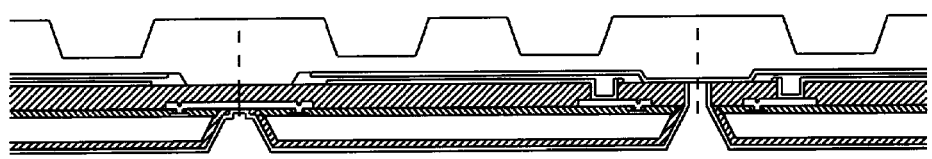
FIG. 33G is a view showing a fabrication process according to the fourth embodiment.
Figure 33H:
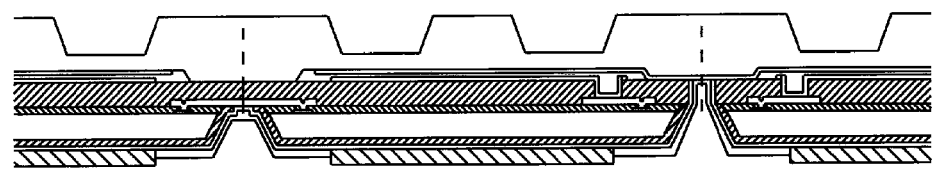
FIG. 33H is a view showing a fabrication process according to the fourth embodiment.
Figure 33I:
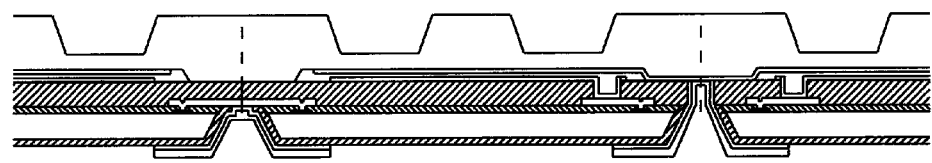
FIG. 33I is a view showing a fabrication process according to the fourth embodiment.

Further, a photosensitive BCB is deposited to form an insulating film on the back surface 420 of the integrated circuit (FIG. 33E). RIE (Reactive Ion Etching) is performed on the deposited BCB, and the first and second sensor electrodes 320 and 330 are exposed outside again (FIGS. 33F).

Note that, in the fabrication process according to the fourth embodiment, the other steps are the same as those of the fabrication process of the first embodiment described above, and the detailed explanation thereof is omitted.

Further, in the first to fourth embodiments, the sensor structure and the semiconductor substrate are integrated (onto a single chip).

In this structure, a sensor signal from the sensor structure 300 can be processed by the integrated circuit 420 embedded in the semiconductor substrate 400.

In this manner, by executing signal processing in each of the tactile sensor devices 200, the signal processing load on the information consolidation device 140 can be reduced.

Because an increase in the processing load on the information consolidation device 140 can be reduced even if a large number of tactile sensor devices 200 are included in the tactile sensor system 100, a revolutionary tactile sensor system in which a fast response is possible in spite of being a large system including a large number of tactile sensor devices 200 can be achieved.

An example of conversion of a sensor signal from the sensor structure into a digital signal is described hereinbelow.

In this example, the diaphragm sensor structure 300 and the LSI in which signal processing units are integrated are bonded by the bonding layer 500 into one integral package as a whole.

The sensor structure 300 includes two electrode plates 320 and 330 placed opposite to each other.

Then, the top surface of the sensor structure 300 functions as the force transfer portion (sensor plane) 311 that comes into contact with an object, and when the force transfer portion 311 is pressed, the distance d between the two electrode plates 320 and 330 changes.

A change in capacitance due to the change in the electrode plate distance d is detected as an analog sensor signal.

Figure 28:
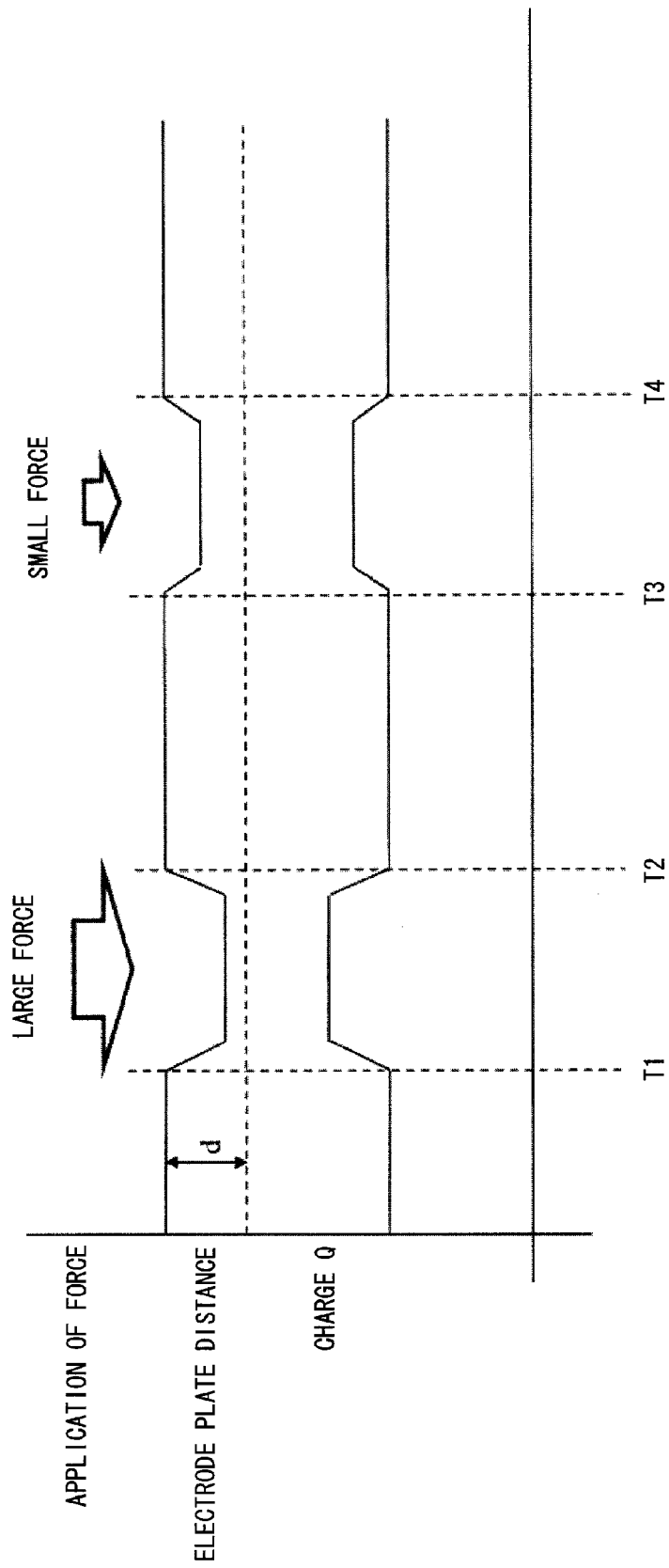
FIG. 28 is a view to explain a procedure to convert a sensor signal into a digital signal.

For example, assume that a large force is applied to the force transfer portion 311 from time T1 to T2, and a small force is applied to the force transfer portion 311 from time T3 to T4 as shown in FIG. 28.

Then, the electrode plate distance d changes according to the applied force.

According to the change in the electrode plate distance d, the charge Q accumulated between the electrode plates changes.

The charge Q between the electrode plates that changes according to the applied force is transmitted as an analog sensor signal to the integrated circuit 420.

Specifically, the charge accumulated in the second sensor electrode 330 is detected by the integrated circuit 420 through the rewiring layer 410 and the electrode pad 421.

The integrated circuit 420 converts the analog sensor signal from the sensor structure 300 into digital.

Figure 29:
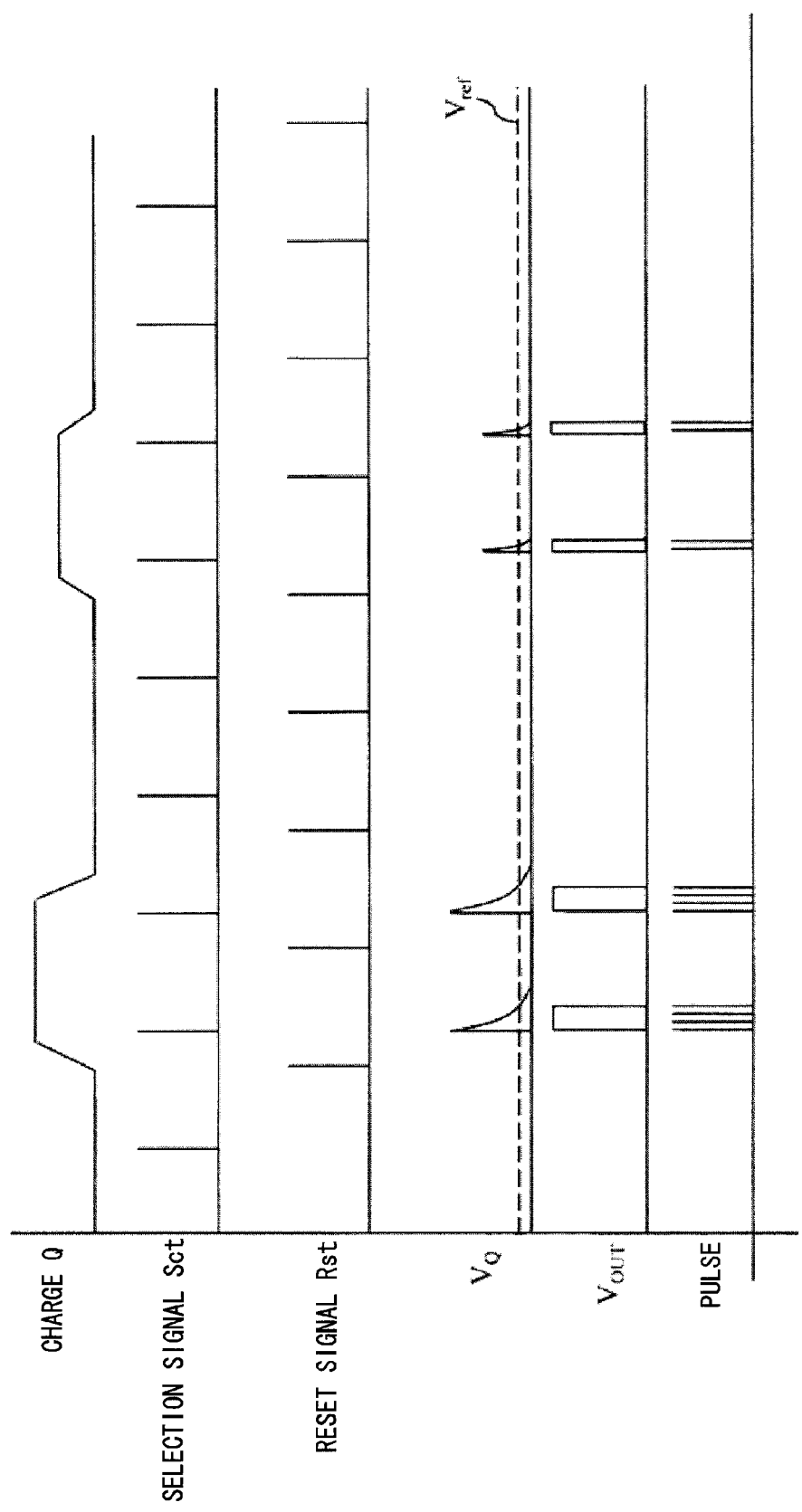
FIG. 29 is a view to explain a procedure to convert a sensor signal into a digital signal.

The digital conversion of a change in capacitance into a change in frequency is described with reference to FIG. 29.

To extract the sensor signal from the sensor structure 300, the integrated circuit 420 outputs a selection signal Sct and a reset signal Rst at regular intervals.

The selection signal Sct is ON signal of a switch (not shown) that is placed between the electrode plate 330 and the integrated circuit 420.

The reset signal Rst is a signal to reset the charge of the electrode plate 330 to GND.

The charge Q between the electrode plates is extracted at regular intervals by the selection signal Sct.

The extracted charge Q between the electrode plates is converted into a voltage $V_Q$ through a specified resistor.

The voltage $V_Q$ is compared with a reference voltage Vref.

A pulse signal Vout having a duration during which $V_Q$ exceeds Vref is generated.

At this time, when a charge extraction rate is constant, the height of $V_Q$ and the pulse width of Vout have a positive correlation.

Vout is converted into a pulse signal with a specified frequency by a pulse generator (not shown).

By counting the number of pulses per unit time, a force applied to the sensor structure 300 can be measured as a digital quantity.

The sensor signal digitized by frequency conversion in the above manner is a digital sensor signal.

The digital sensor signal generated in this manner is transmitted from each of the tactile sensor devices 200 to the information consolidation device 140.

The signal may be transmitted by differential serial transmission through the two signal lines 113 and 113 of the bus.

By transmitting the digital signal from the tactile sensor devices 200 to the information consolidation device 140 in this manner, it is less likely to be affected by the noise even when the line between the tactile sensor device 200 and the information consolidation device 140 is long.

For example, if the tactile sensor devices 200 are provided on the whole body surface of the robot, the entire line length is considerably long, and therefore noise immunity is important.

Compared to the case of transmitting the analog signal, the structure of this embodiment is suitable for the sensor system that includes a large number of tactile sensor devices 200.

(Fifth Embodiment)

Although the support frame portion 313 and the force transfer portion 311 have the same height in the first to fourth embodiments described above, it is preferred that the force transfer portion 311 is higher than the support frame portion 313 in order to effectively detect a shearing force.

Thus, in the fifth embodiment, the support frame portion 313 is cut by half-dicing at the stage of cutting the sensor devices 200 from the wafer, so that the force transfer portion 311 is set higher than the support frame portion 313 as described above.

FIGS. 34A to 34D are views showing a fabrication process according to the fifth embodiment. Note that the fabrication process according to the fifth embodiment is applicable to the first to fourth embodiments described above.

Figure 34A:
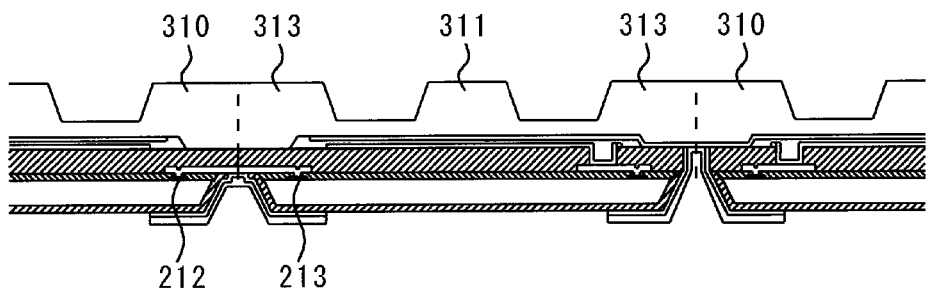
FIG. 34A is a view showing a fabrication process according to a fifth embodiment.
Figure 34B:
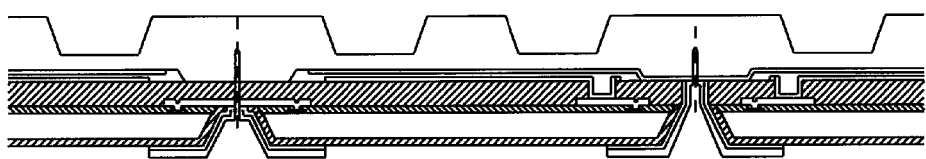
FIG. 34B is a view showing a fabrication process according to the fifth embodiment.
Figure 34C:
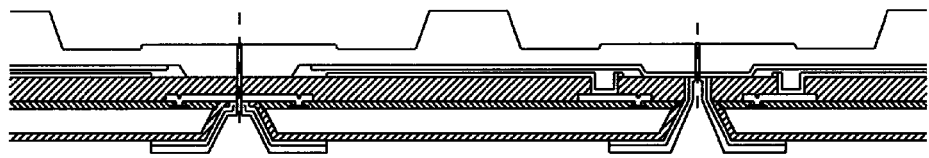
FIG. 34C is a view showing a fabrication process according to the fifth embodiment.

As shown in FIG. 34A, after the electrode pads 212 and 213 are formed, half-dicing is performed from the semiconductor substrate 400 side. At this time, the cutting depth is set as a depth enough to reach the structure main body 310 (FIG. 34B).

Figure 34D:
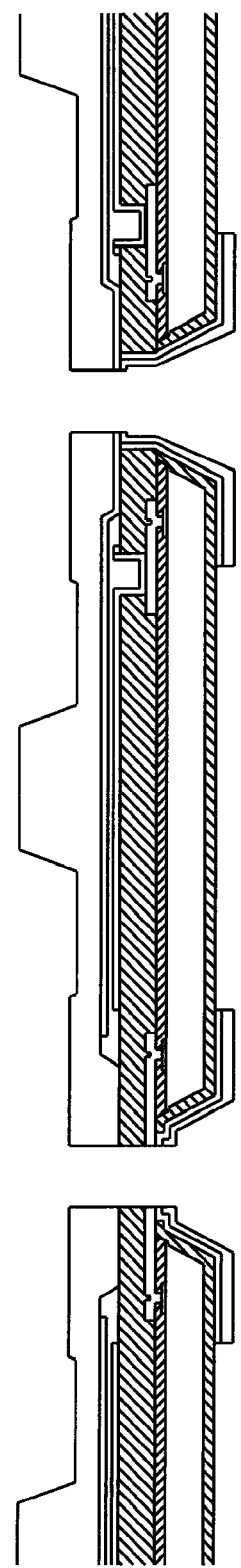
FIG. 34D is a view showing a fabrication process according to the fifth embodiment.

Next, the support frame portion 313 is cut by half-dicing from the front side (FIG. 34C), and element isolation is done naturally (FIG. 34D). It is preferred in the half-dicing to perform cutting into the thickness that does not cause the diaphragm performance to vary.

This process allows the force transfer portion 311 to be higher than the support frame portion 313 at the same time as element isolation, thereby enhancing the sensitivity to a shearing force and enabling effective detection of a shearing force.

The present invention is not limited to the embodiments described above, and various changes and modifications may be made without departing from the scope of the invention.

The structure that facilitates application of a force to the structure main body 310 and brings about accurate deformation of the structure main body 310 by the diaphragm structure composed of the raised force transfer portion 311 and the thin portion 312, and senses the force as a change in the capacitance of the capacitor composed of the first sensor electrode 320 and the second sensor electrode 330 formed internally is described above by way of illustration.

The structure may be used for the device that applies a pressure to the diaphragm structure composed of the raised force transfer portion 311 and the thin portion 312 and brings about deformation of the structure main body 310, and senses the pressure as a change in the capacitance of the capacitor composed of the first sensor electrode 320 and the second sensor electrode 330 formed internally.

Because there is a raised part at the center of the diaphragm, the deformation of the diaphragm does not concentrate to the center. The diaphragm is thereby deformed in a relatively uniform manner, and a large pressure change can be detected with high accuracy.

The device may be configured such that external heat or heat due to a temperature difference is transferred to the diaphragm structure composed of the raised force transfer portion and the thin portion 312, a shape distortion of the structure main body 310 occurs due to thermal expansion, and a thermal change or a temperature change is sensed as a change in the capacitance of the capacitor composed of the first sensor electrode 320 and the second sensor electrode 330 formed internally.

Although a capacitance change due to heat is described in this example, a resistance change due to temperature or a temperature characteristic change at a p-n junction may be detected by the electrode inside the sensor and the signal processing circuit.

Figure 30:
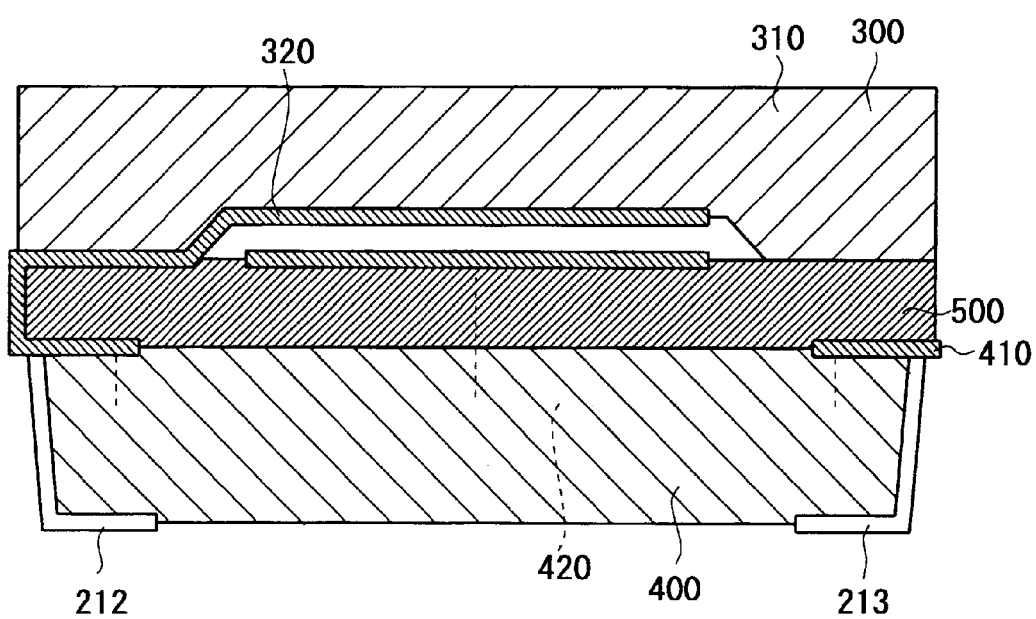
FIG. 30 is a view showing a structure of the present invention in the simplest manner.

FIG. 30 is a view showing a structure of the present invention in the simplest manner.

As shown in FIG. 30, a sensor structure having a sensor electrode and a semiconductor substrate are bonded by a bonding layer, and the sensor electrode and an external terminal of an integrated circuit are led out to the back surface of the semiconductor substrate through the side surface of the semiconductor substrate.

In the sensor structure, the internal sensor electrode can detect a physical quantity such as a pressure, heat or the like applied to the contact sensing surface on the front side.

In this case, the contact sensing surface is not limited to a diaphragm as a matter of course.

Further, materials of the bonding layer 500, the protective film 250 and the like may be altered as appropriate as a matter of course.

REFERENCE SIGNS LIST

10 . . . ROBOT, 11 . . . HAND, 100 . . . TACTILE SENSOR SYSTEM, 110 . . . BUS, 112 . . . POWER SUPPLY LINE, 113 . . . SIGNAL LINE, 120 . . . INFORMATION RELAY DEVICE, 130 . . . LINE CONCENTRATION DEVICE, 140 . . . INFORMATION CONSOLIDATION DEVICE, 200 . . . SENSOR DEVICE, 211 . . . INCLINED SURFACE, 212, 213 . . . LEAD LINE, 220 . . . SIDE END SURFACE, 221 . . . INCLINED SURFACE, 230, 231, 232, 233, 234 . . . LEAD LINE, 240 . . . BACK SURFACE, 241, 242, 243, 244 . . . EXTERNAL TERMINAL, 250 . . . PROTECTIVE FILM, 251 . . . HOLE, 252 . . . GROOVE, 254 . . . CORNER, 255 . . . BASE INSULATING FILM, 300 . . . SENSOR STRUCTURE, 310 . . . STRUCTURE MAIN BODY, 311 . . . FORCE TRANSFER PORTION, 312 . . . THIN PORTION, 313 . . . SUPPORT FRAME PORTION, 314 . . . RECESSED PORTION, 315 . . . WAFER, 316 . . . SIDE SURFACE, 317 . . . MASK, 317 . . . GROOVE, 320 . . . SENSOR ELECTRODE, 330 . . . SENSOR ELECTRODE, 400 . . . SEMICONDUCTOR SUBSTRATE, 410 . . . REWIRING LAYER, 420 . . . INTEGRATED CIRCUIT, 421 . . . ELECTRODE PAD, 430 . . . PASSIVATION FILM, 500 . . . BONDING LAYER, 510 . . . VIA, 520 . . . RESIST, 600 . . . GLASS SUBSTRATE, 700 . . . LTCC SUBSTRATE, 710 . . . WIRING LAYER, 720 . . . VIA

The invention claimed is:

1. A sensor device comprising:
a sensor structure including a contact sensing surface that comes into direct contact with a detection target on one surface exposed outside and a sensor electrode that outputs an analog sensor signal upon sensing a change in the contact sensing surface at another surface side on an opposite side of the contact sensing surface;
a semiconductor substrate including an embedded signal processing integrated circuit that processes the analog sensor signal; and
a bonding layer interposed between said another surface of the sensor structure and the semiconductor substrate to bond the sensor structure and the semiconductor substrate together, wherein
the sensor structure and the semiconductor substrate are stacked into a single chip with the sensor electrode and the integrated circuit placed opposite to each other with the bonding layer interposed therebetween,
the sensor electrode and the integrated circuit are sealed inside the sensor device, and wherein the sensor electrode is connected to at least one of the following: a line portion of the sensor electrode that leads to an external bus and an electrode portion of the integrated circuit that leads to an external bus;
wherein at least one external terminal of the signal processing integrated circuit is connected to at least one of the following: the line portion of the sensor electrode that leads to the external bus and the electrode portion of the integrated circuit that leads to the external bus;
wherein the sensor electrode and the at least one external terminal of the signal processing integrated circuit are placed opposite to each other with the bonding layer interposed therebetween; and
wherein the line portion of the sensor electrode that leads to the external bus and the electrode portion of the integrated circuit that leads to the external bus are formed on a back surface of the semiconductor substrate through a laterally inclined surface of the semiconductor substrate.

2. The sensor device according to claim 1, wherein the bonding layer is BCB (Benzocyclobutene).

3. The sensor device according to any one of claim 1, comprising:
the sensor electrode placed on a back surface of the sensor structure; and
another sensor electrode placed on the bonding layer, wherein
the sensor structure and the semiconductor substrate are bonded together by the bonding layer with the two sensor electrodes placed opposite to each other.

4. The sensor device according to claim 3, wherein
the bonding layer has a via, and
said another sensor electrode is connected to the electrode portion of the integrated circuit through the via.

5. The sensor device according to claim 1
wherein the sensor electrode is placed on a back surface of the sensor structure; and
another sensor electrode is placed on one surface of a ceramic substrate, wherein
the sensor structure and the ceramic substrate are bonded together with the two sensor electrodes placed opposite to each other, and
the ceramic substrate and the semiconductor substrate are bonded together by a bonding layer placed on another surface of the glass substrate.

6. The sensor device according to claim 1, wherein connection between the sensor electrode and the integrated circuit is made by the line portion of the sensor electrode that leads to an external bus or the at least one external terminal of the signal processing integrated circuit on a side end surface of the semiconductor substrate.

7. The sensor device according to claim 1, wherein a thickness of the bonding layer is 10 μm or larger as a means of reducing parasitic capacitance between the sensor electrode and the integrated circuit.

8. The sensor device according to claim 1, wherein
the contact sensing surface comes into contact with the detection target and transfers a contact pressure or heat to the sensor electrode, and
the sensor structure detects a force, a contact force, a contact pressure or the heat.

9. A sensor device comprising:
a sensor structure including a contact sensing surface that comes into direct contact with a detection target on one surface exposed outside and a sensor electrode that outputs an analog sensor signal upon sensing a change in the contact sensing surface at another surface side on an opposite side of the contact sensing surface;

a semiconductor substrate including an embedded signal processing integrated circuit that processes the analog sensor signal; and a bonding layer interposed between said another surface of the sensor structure and the semiconductor substrate to bond the sensor structure and the semiconductor substrate together, wherein the sensor structure and the semiconductor substrate are stacked into a single chip with the sensor electrode and the integrated circuit placed opposite to each other with the bonding layer interposed therebetween, the sensor electrode and the integrated circuit are sealed inside the sensor device, and wherein the sensor electrode is connected to at least one of the following: a line portion of the sensor electrode that leads to an external bus and an electrode portion of the integrated circuit that leads to an external bus;

wherein at least one external terminal of the signal processing integrated circuit is connected to at least one of the following: the line portion of the sensor electrode that leads to the external bus and the electrode portion of the integrated circuit that leads to the external bus;

wherein the line portion of the sensor electrode that leads to the external bus and the electrode portion of the integrated circuit that leads to the external bus are formed on a back surface of the semiconductor substrate through a laterally inclined surface of the semiconductor substrate, wherein the sensor electrode and the at least one external terminal of the signal processing integrated circuit are led out to the back surface of the semiconductor substrate through the side surface of the semiconductor substrate, and a cut for drawing out the line portion of the sensor electrode has a deeper cut depth than a cut for drawing out an electrode of the integrated circuit.

10. The sensor device according to claim 9, wherein a direction to draw out the line portion of the sensor electrode and a direction to draw out the electrode of the integrated circuit are orthogonal to each other on the back surface of the semiconductor substrate.

11. A sensor device comprising:

a sensor structure including a contact sensing surface that comes into direct contact with a detection target on one surface exposed outside and a sensor electrode that outputs an analog sensor signal upon sensing a change in the contact sensing surface at another surface side on an opposite side of the contact sensing surface;

a semiconductor substrate including an embedded signal processing integrated circuit that processes the analog sensor signal; and a bonding layer interposed between said another surface of the sensor structure and the semiconductor substrate to bond the sensor structure and the semiconductor substrate together, wherein the sensor structure and the semiconductor substrate are stacked into a single chip with the sensor electrode and the integrated circuit placed opposite to each other with the bonding layer interposed therebetween, the sensor electrode and the integrated circuit are sealed inside the sensor device, and wherein the sensor electrode is connected to at least one of the following: a line portion of the sensor electrode that leads to an external bus and an electrode portion of the integrated circuit that leads to an external bus;

wherein at least one external terminal of the signal processing integrated circuit is connected to at least one of the following: the line portion of the sensor electrode that leads to the external bus and the electrode portion of the integrated circuit that leads to the external bus;

wherein the line portion of the sensor electrode that leads to the external bus and the electrode portion of the integrated circuit that leads to the external bus are formed on a back surface of the semiconductor substrate through a laterally inclined surface of the semiconductor substrate;

wherein the sensor electrode is placed on a back surface of the sensor structure; and another sensor electrode is placed on one surface of a glass substrate, wherein the sensor structure and the glass substrate are bonded together with the two sensor electrodes placed opposite to each other, and the glass substrate and the semiconductor substrate are bonded together by the bonding layer placed on another surface of the glass substrate.

* * * * *